(12) United States Patent
Numai

(10) Patent No.: US 6,275,296 B1
(45) Date of Patent: Aug. 14, 2001

(54) SEMICONDUCTOR LASER GYRO WITH MODULATED DRIVING POWER SOURCE

(75) Inventor: Takahiro Numai, Ninomiya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/419,780

(22) Filed: Oct. 18, 1999

(30) Foreign Application Priority Data

Oct. 19, 1998 (JP) .................................................. 10-296580
Jul. 30, 1999 (JP) .................................................. 11-217189

(51) Int. Cl.⁷ .................................................. G01C 19/66
(52) U.S. Cl. .................................................. 356/459
(58) Field of Search .................................. 356/459, 460, 356/461; 362/94

(56) References Cited

U.S. PATENT DOCUMENTS

| 4,431,308 | 2/1984 | Mitsuhashi et al. | 356/461 |
| 4,913,548 | 4/1990 | Vick | 356/461 |

FOREIGN PATENT DOCUMENTS

| 8-018166 | 1/1966 | (JP) . |
| 60-52078 | 3/1985 | (JP) . |
| 60-148185 | 8/1985 | (JP) . |
| 62-39836 | 8/1987 | (JP) . |
| 4-174317 | 6/1992 | (JP) . |
| 5-288556 | 11/1993 | (JP) . |
| 6-140364 | 5/1994 | (JP) . |
| 6-38529 | 5/1994 | (JP) . |
| 7-131123 | 5/1995 | (JP) . |
| 7-146150 | 6/1995 | (JP) . |
| 8-125251 | 5/1996 | (JP) . |

Primary Examiner—Samuel A. Turner
(74) Attorney, Agent, or Firm—Fitzpatrick, Cella, Harper & Scinto

(57) ABSTRACT

An optical gyro reduces the coupling loss generated when emitted laser beams are incident upon a photo detector and the noise generated by the laser beams reentering the laser from an external point of reflection. The gyro includes a ring resonator type semiconductor laser for having laser beams transmitted circularly in opposite directions relative to each other and a terminal for detecting a beat signal, with the active layer of the semiconductor laser being ring-shaped.

26 Claims, 29 Drawing Sheets

SEMICONDUCTOR LASER GYRO WITH MODULATED DRIVING POWER SOURCE

BACKGROUND OF THE INVENTION

1. Field of the Invention

This invention relates to a gyro and a method of operating such a gyro. More particularly, the present invention relates to an optical gyro adapted to reduce the coupling loss generated when laser beams are incident upon a photodetector and the noise generated by feedback laser beams reentering the laser from an external point of reflection as well as to a method of operating such an optical gyro.

2. Related Background Art

Mechanical gyros comprising a rotor and a vibrator as well as optical gyros adapted to detect the angular velocity of a moving object are known. Particularly, optical gyros are regarded as innovative because they can start to operate instantaneously and provide a wide dynamic range. Optical gyros including ring resonator type gyros, optical fiber gyros and passive type ring resonator gyros, of which ring resonator type gyros comprising a gas laser were developed most early and have been used in aeronautic applications and other applications. Recently, small, high precision, ring resonator type laser gyros have been proposed and Japanese Patent Application Laid-Open No. 5-288556 described such a gyro.

However, known ring resonator type laser gyros are so designed that a laser beam propagating clockwise and another laser beam propagating counterclockwise are once emitted therefrom to the outside and received by a photodetector, which transforms their optical beat into electric beat as signal. This means that a coupling loss arises when the laser beams are incident upon the photodetector. Additionally, known ring resonator type laser gyros need an optical isolator in order to avoid the noise generated by the laser beams returning from an external point of reflection to the laser.

SUMMARY OF THE INVENTION

Therefore, it is an object of the present invention to provide a gyro that is totally or almost free from any coupling loss and optical feedback noise and a method of operating such gyro. Another object of the present invention is to provide a method of reducing the driving power necessary for driving a semiconductor ring laser. Still another object of the present invention is to provide a method of stabilizing the oscillation wavelength of a semiconductor ring laser.

According to the invention, there is provided a gyro comprising a ring resonator type semiconductor laser for emitting laser beams to be transmitted circularly in opposite senses relative to each other and a terminal for detecting the beat signal generated by the rotation of the ring resonator type semiconductor laser, said ring resonator type semiconductor laser having a central region for structurally obstructing the flow of any electric current.

According to an aspect of the invention, there is provided a gyro comprising a ring resonator type semiconductor laser for emitting laser beams to be transmitted circularly in opposite directions relative to each other and a terminal for detecting a beat signal, the active layer of the semiconductor laser being ring-shaped.

Preferably, the active layer is sandwiched by low refractive index layers showing a refractive index lower than that of the active layer and both the active layer and the low refractive index layers have a hollow pillar-like profile.

Preferably, said beat signal is detected as a change in the electric current flowing through, the voltage applied to or the impedance of the ring resonator type semiconductor laser.

According to another aspect of the invention, there is provided a gyro comprising a ring resonator type semiconductor laser for emitting laser beams to be transmitted circularly in opposite senses relative to each other and a means for detecting the beat signal generated by the rotation of the ring resonator type semiconductor laser, the active layer of said semiconductor laser being ring-shaped.

Preferably, said beat signal detection means includes at least a voltage detector, an electric current detector, an impedance detector, a frequency/voltage converter or a frequency counter.

According to still another aspect of the invention, there is provided a gyro comprising a ring resonator type semiconductor laser for emitting laser beams to be transmitted circularly in opposite senses relative to each other and a terminal for detecting a beat signal, said ring resonator type semiconductor laser having a central region at least partly showing a high resistivity.

According to still another aspect of the invention, there is provided a gyro comprising a ring resonator type semiconductor laser for emitting laser beams to be transmitted circularly in opposite senses relative to each other and a means for detecting the beat signal generated by the rotation of the ring resonator type semiconductor laser, said ring resonator type semiconductor laser having a central region at least partly showing a high resistivity.

According to still another aspect of the invention, there is provided a semiconductor device comprising a ring resonator type semiconductor laser having a ring-shaped active layer for emitting laser beams to be transmitted circularly in opposite senses relative to each other and a terminal for detecting a beat signal.

According to a further aspect of the invention, there is provided a semiconductor laser comprising an active layer and a low refractive index layer arranged above the active layer and showing a refractive index lower than that of the active layer, at least either the active layer or the low refractive index layer having a central region showing a high resistivity as a result of ion implantation.

DETAILED DESCRIPTION OF THE PREFERRED EMBODIMENTS

Firstly, a method of detecting an angular velocity by means of a semiconductor laser according to the invention will be described by referring to FIG. 1.

Figure 1:
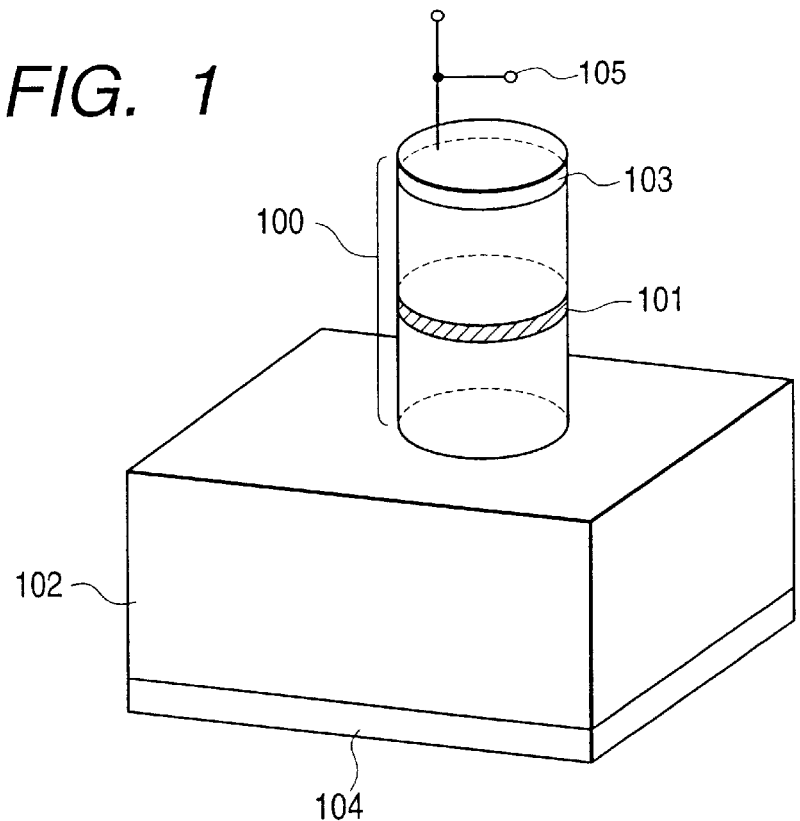
FIG. 1 is a schematic illustration of a method for detecting an angular velocity by means of a ring resonator type semiconductor laser.

In FIG. 1, there are shown a semiconductor laser 100, an active layer 101, a substrate 102, an anode 103 and a cathode 104. Reference number 105 denotes an electric terminal. Note that the active layer 101 is sandwiched by cladding layers. As an electric current is injected, the resonance guided mode along a ring cavity is selectively amplified and a laser oscillation takes place when a threshold value is exceeded.

With the ring resonator type semiconductor laser arranged in the above described manner, the laser beams that are generated in the ring resonator type laser are transmitted circularly. More specifically, there are a laser beam made to propagate clockwise and a laser beam made to propagate counterclockwise. So long as the ring resonator type laser is held at a halted state, the laser beam propagating clockwise and the laser beam propagating counterclockwise have the same oscillation frequencies. However, when the laser is driven to turn, the laser beam propagating clockwise and the laser beam propagating counterclockwise give rise to a difference of oscillation frequencies. The difference of oscillation frequency Δf is expressed by formula (1) below;

$$\Delta f = (4S/\lambda L)\Omega \tag{1}$$

where S is the area of the closed domain surrounded by the optical path, $\lambda$ is the oscillation wavelength of the laser beams, L is the length of the optical path and $\Omega$ is the angular velocity of rotation. In a laser in which electric current is made to flow such as a gas laser or a semiconductor laser, the population inversion and the impedance show a 1 to 1 correspondence. When the laser beams interfere with each other in the laser, the population inversion changes due to the interference to consequently change the impedance between the electrodes of the laser. The change appears as the change in the electric current flowing through the laser when a constant voltage source is used as driving power source, or alternatively appears as the change in the terminal voltage when a constant current source is need. Thus, in either case, the information of light can be taken out as a single. A battery can be used as the constant voltage source to make the driving system down-sized and lightweight.

The change in the impedance can be observed directly by means of an impedance meter, as a matter of course. In this case, the influence of the driving power source noise can be minimized unlike the case of observing the terminal voltage or the electric current flowing to an element of the laser.

If it is necessary to prevent any surge noise from entering the semiconductor laser through the detection terminal for detecting the change in the terminal voltage of the semiconductor laser, a protection circuit is preferably arranged between the circuit for observing the change in the voltage and the detection terminal. Then, the semiconductor laser can be protected against degradation and destruction due to surge noise and/or some other causes.

As described above, by detecting the change, if any, in the electric current, the voltage or the impedance attributable to the beat generated by the interference of the laser beams transmitted circularly in opposite senses, the beat signal can be taken out as a function of the angular velocity of the semiconductor laser. Thus, the present invention provides an gyro that operates without a photodetector and an optical system for realizing an optical coupling that are indispensable to conventional gyros.

Additionally, the laser beams circularly transmitted can preferentially get a gain by providing the semiconductor laser with a means for obstructing the flow of any electric current in a central region thereof or a means for injecting an electric current into a peripheral region of the active layer thereof.

Since it is the laser beams being transmitted within the semiconductor laser that affect the population inversion, there is no need of taking the laser beams out of the semiconductor laser. Thus, it is possible to make the semiconductor laser to have a total internal reflection plane on a lateral side thereof. With such a total internal reflection plane, the mirror loss is reduced to consequently lower the oscillation threshold value of the laser.

An gyro according to the invention is characterized in that it is not provided with a reflector having a total internal reflection plane within the reach of the seeping evanescent light generated from either of the ring resonator type laser. If there is such a reflector within the reach of the seeping evanescent light, the reflector can be optically coupled with the laser to give rise to a loss from the viewpoint of the laser side and there arises a beam returning from the reflector to the laser to operate as noise source.

To the contrary, so long as no reflector is present within the reach of the seeping evanescent light of the laser, the laser will be optically isolated from any other reflectors to become free from the influence of the outside and the loss attributable to external factors. Additionally, there will be no noise due to the returning beam. Thus, the coupling loss and the noise due to the returning beam can be remarkably reduced with this arrangement.

With a method of operating a gyro according to the invention, the change in the electric current, the voltage or the impedance detected at the terminal is used as signal for determining the angular velocity of the ring resonator type laser to eliminate the use of a photodetector and an optical system for optical coupling that is indispensable for conventional gyros so that a method of operating a gyro according to the present invention can dissolve the problem of coupling loss and that of the noise caused by the returning beams that are attributable to such components.

With a method of operating a gyro according to the invention, preferably the voltage or the electric current for driving the ring resonator type laser is modulated in a frequency not found in the frequency band of said signal generated by the change in the terminal voltage, the electric current or the impedance due to a beat.

As the gyro having a configuration as described above is driven to rotate, the oscillation frequency of the laser beam propagating clockwise and that of the laser beam propagating counterclockwise come to show a difference $\Delta f$ that is expressed by formula (1) above. However, so long as the frequency difference $\Delta f$ is small, it will be reduced to nil, or $\Delta=0$, because the oscillation frequencies are pulled each other due to the non-linearity of the laser medium. This is a phenomenon referred to as lock-in.

This lock-in phenomenon is desirably avoided by holding the gyro in a state where the frequency difference $\Delta f$ between the two oscillation frequencies constantly fluctuates.

Conventionally, the lock-in phenomenon is avoided by means of a dithering technique, which has an effect of modulating the angular velocity $\Omega$ in formula (1) above.

In the case of a semiconductor laser, for instance, it is known that the oscillation frequency is fluctuated as a function of the electric current. This is because the refractive index of the semiconductor changes as a function of the electric current.

Therefore, $\lambda$ in formula (1) can be modulated to make it possible to produce a state where $\Delta f$ always fluctuates.

Then, the lock-in phenomenon can be avoided without adversely affecting the signal by modulating the laser oscillation frequency in a frequency band different from that of the beat signal.

Of course, a similar effect can be obtained by modulating the voltage by way of a resistor connected in series because the electric current flowing to the semiconductor laser is also modulated.

In a gas laser, the value of Q of the active medium can be fluctuated by modulating the electric current or the voltage in order to fluctuate the oscillation frequency. This is because the oscillation frequency of the gas laser is determined by the Q value of resonance transition of atoms, molecules or ions and that of the resonator and this effect is referred to as that of "the oscillation frequency pulling".

Additionally, the direction of vibration and the frequency of the terminal voltage can be made to correspond to each other by applying a vibration to a gyro comprising a ring resonator type laser in a frequency band different from that of the beat signal and detecting the signal from the terminal synchronously with the vibration. For instance, when a vibration is applied clockwise to the gyro, the frequency of the terminal voltage will be raised if the gyro is driven to turn clockwise whereas the frequency of the terminal voltage will be lowered if the gyro is driven to turn counterclockwise. Thus, it is possible to detect if the gyro is turning clockwise or counterclockwise by utilizing this technique without adversely affecting the signal by modulating the laser oscillation frequency in a frequency band different from that of the beat signal.

Now, a gyro and a method of operating the same according to the invention will be described in greater detail along with their advantages by referring to the accompanying drawings.

Embodiment 1

Figure 2:
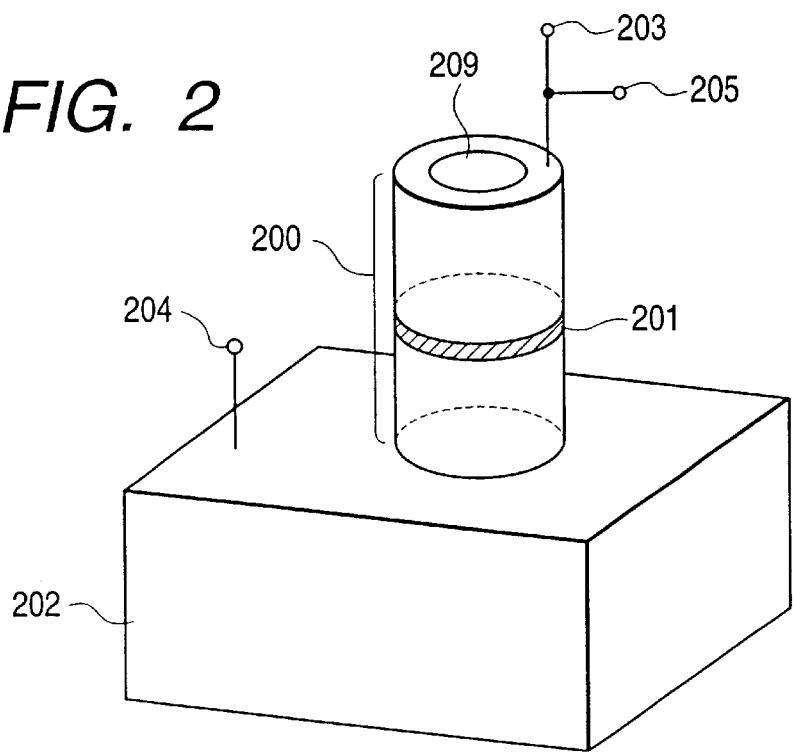
FIG. 2 is a schematic perspective view of the first embodiment of a gyro comprising a ring resonator type semiconductor laser according to the invention.

FIG. 2 is a schematic perspective view of an embodiment of gyro comprising a ring resonator type laser for having laser beams to be transmitted circularly. In this embodiment, the semiconductor laser 200 has a central region at least partly including a hollow cylindrical pillar-like part 209. Reference numeral 201 in FIG. 2 denotes an active layer. Layers including cladding layers are arranged on and under the active layer. Additionally, in FIG. 2, reference numeral 202 denotes a substrate for carrying the semiconductor laser thereon and reference numeral 203 denotes an anode and wires connected to the anode, while reference numeral 204 denotes a cathode and reference numeral 205 denotes an electric terminal.

It may be needless to say that a guiding layer is preferably arranged between the active layer and any of the cladding layer in order to raise the optical confinement factor of the active layer.

Figure 3:
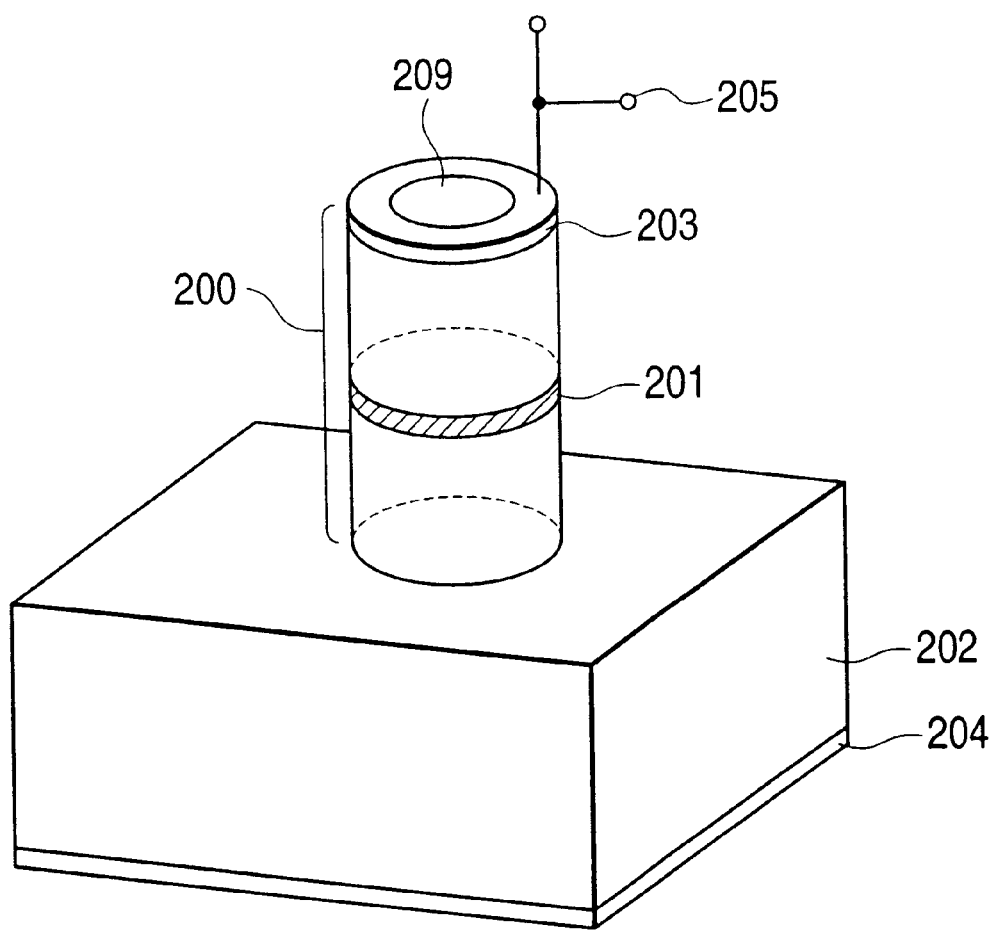
FIG. 3 is a schematic perspective view of an embodiment obtained by modifying the first embodiment of a gyro comprising a ring resonator type semiconductor laser according to the invention.

The locations and the configuration of the electrodes are not limited to those of FIG. 2. FIG. 3 shows an embodiment obtained by modifying the embodiment of FIG. 2 particularly in terms of the configuration and the locations of the electrodes.

Figure 4:
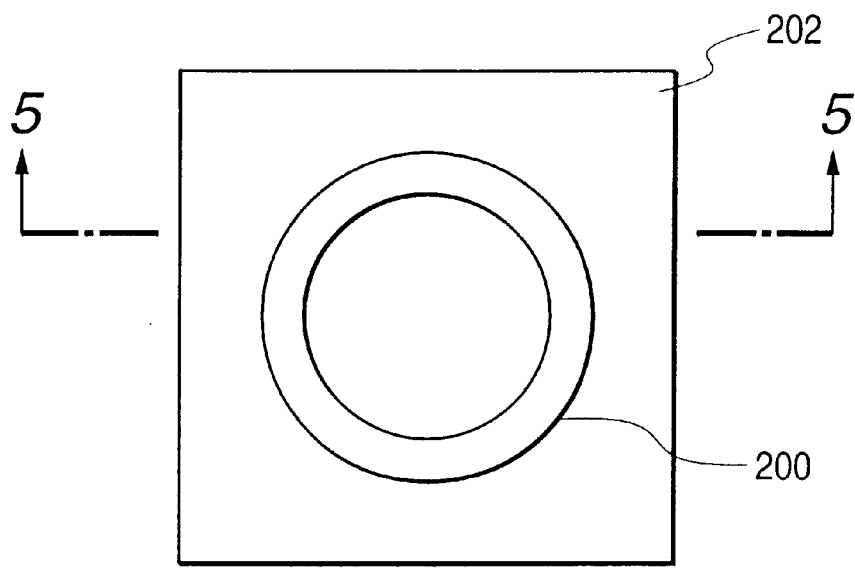
FIG. 4 is a schematic plan view of the first embodiment of gyro comprising a ring resonator type semiconductor laser according to the invention.

FIG. 4 is a schematic plan view of the semiconductor laser of FIG. 3, which has a hollow cylindrical pillar-like profile.

Figure 5:
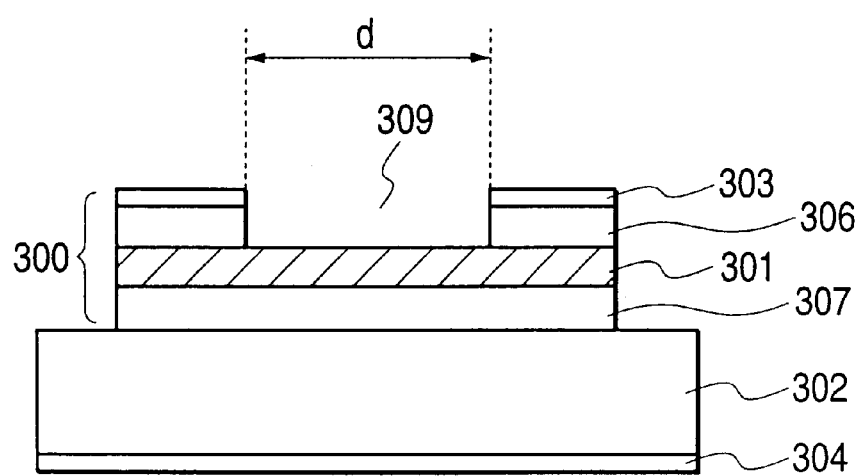
FIG. 5 is a schematic cross sectional view of the first embodiment of a gyro comprising a ring resonator type semiconductor laser according to the invention.

FIG. 5 is a schematic cross sectional view of the semiconductor laser of FIG. 4 taken along line 5—5 in FIG. 4. In FIG. 5, there are shown a semiconductor laser 300, an active layer 301, a substrate 302, an anode 303, a cathode 304, an upper cladding layer 306 and a lower cladding layer 307.

By hollowing at least the upper cladding layer 306 at a central region thereof to produce a hollow cylindrical pillar-like profile 309, the central region of the semiconductor laser tends to obstruct the electric current flowing therethrough. Thus, this arrangement allows only the laser beams being transmitted circularly to get a gain so as to reduce any inactive electric current. Particularly, the beat frequency will be highly stabilized when a single transverse mode is realized.

Referring to FIG. 5, which does not particularly show a guiding layer and a cap layer, it is sufficient that at least the upper cladding layer 306 is hollowed at a central region thereof for the purpose of the invention if such layers are present.

Figure 6:
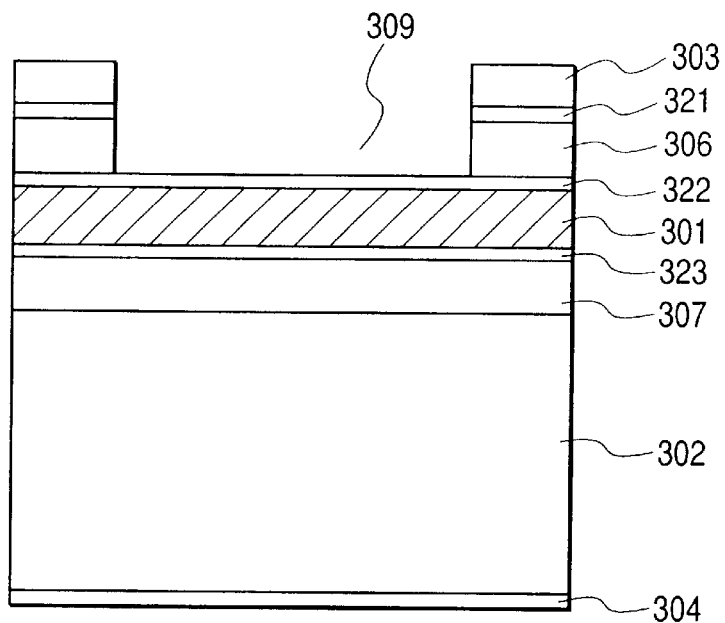
FIG. 6 is another schematic cross sectional view of the first embodiment of a gyro comprising a ring resonator type semiconductor laser according to the invention.

FIG. 6 shows an arrangement where a cap layer 321 and guiding layers 322 and 323 are present.

It is also possible for the purpose of the invention to arrange hollow cylindrical pillar-like electrodes without modifying profile of the upper cladding layer and that of the cap layer.

Figure 7:
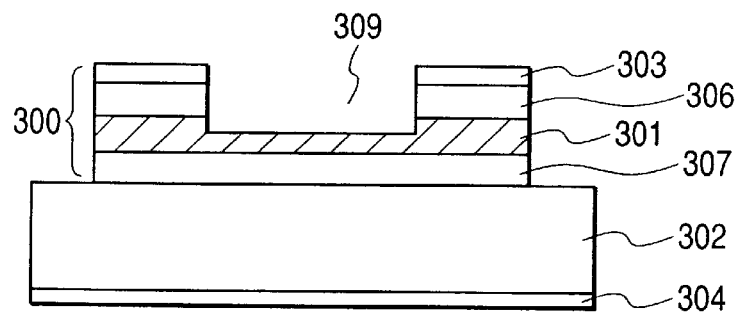
FIG. 7 is still another schematic cross sectional view of the first embodiment of a gyro comprising a ring resonator type semiconductor laser according to the invention.
Figure 8:
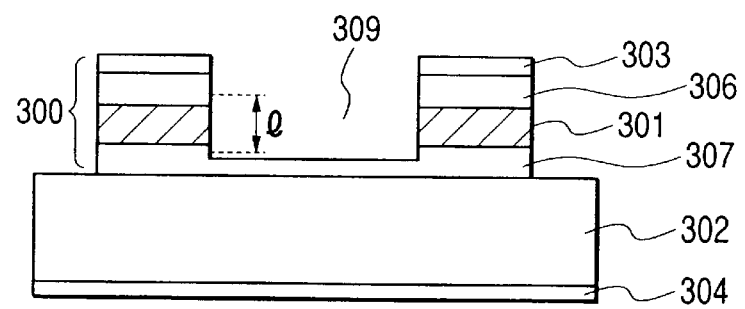
FIG. 8 is still another schematic cross sectional view of the first embodiment of a gyro comprising a ring resonator type semiconductor laser according to the invention.

It is also preferable that the active layer 301 is at least partly made to have a hollow cylindrical pillar-like profile as shown in FIG. 7. Alternatively, the lower cladding layer 307 may be at least partly made to have a hollow cylindrical pillar-like profile as shown in FIG. 8. When the active layer is partly made to show a hollow cylindrical pillar-like profile, the threshold electric current can be reduced more effectively because the volume of the active layer is reduced.

Particularly, the presence of a hollow cylindrical pillar-like profile is advantageous in a region where laser beams are distributed (e.g., region with a height of l in FIG. 8). More specifically, it is preferable that the active layer shows a ring-shaped (or doughnut-shaped) profile.

If, for example, the active layer has a thickness of 0.1 $\mu$m, the distance l in FIG. 8 is 1 $\mu$m.

Provided that the active layer has a constant thickness, the semiconductor laser can advantageously be driven with a low driving current when the semiconductor laser has a ring-shaped profile within the range of l in FIG. 8, or within the reach of the seeping evanescent light in a direction perpendicular to the surface of the active layer, to raise the coefficient of light confinement of the active layer. Then, the oscillation frequency of semiconductor laser will be stabilized. Alternatively, the entire semiconductor laser 300 may have a hollow cylindrical pillar-like profile (ring-ridge profile) as shown in FIG. 9.

While the reach l of the seeping evanescent light is limited within the cladding layers 306, 307 in FIG. 8, it may alternatively go beyond the cladding layers depending on the refractive index and the thickness of the cladding layers. If such is the case, it is desirable that at least the portion of the semiconductor laser located within the reach l of the seeping evanescent light has a hollow cylindrical pillar-like profile. If the seeping evanescent light gets to the guiding layers between the active layer and the respective cladding layers and even to the substrate 302, it is also desirable that the guiding layers and the part of the substrate located within the reach l of the seeping evanescent light has a hollow cylindrical pillar-like profile.

Therefore, if the loss of light should be minimized and the semiconductor laser is required to be driven with a low electric current or a low voltage, it is desirable that the loss of light is reduced in the low refractive index layers 306, 307.

Figure 9:
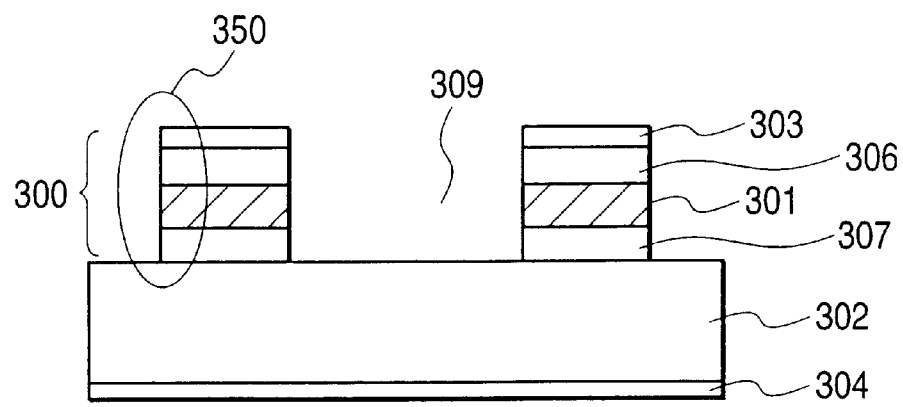
FIG. 9 is still another schematic cross sectional view of the first embodiment of a gyro comprising a ring resonator type semiconductor laser according to the invention.
Figure 59:
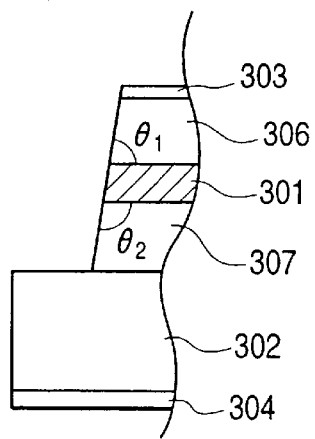
FIG. 59 is a schematic partial cross sectional view of still another embodiment of ring resonator type semiconductor laser according to the invention.

FIG. 59 is an enlarged schematic partial view of the semiconductor laser of FIG. 9, showing only the region 350 of FIG. 9. For driving the semiconductor laser with a low electric power, the semiconductor laser is preferably so configured that the angles $\theta_1$, $\theta_2$ between the corresponding surfaces of the low refractive index layers and the active layer are defined respectively by $$75° \leq \theta_1, \theta_2 \leq 105°,$$

preferably by $$80° \leq \theta_1, \theta_2 \leq 100°,$$

more preferably by $$85° \leq \theta_1, \theta_2 \leq 95°.$$

Any loss of light due to the seeping evanescent light can be prevented from taking place to make it possible to drive the semiconductor laser with a low electric current (or low voltage) when the above requirements are met.

It is also desirable that the semiconductor laser has a total internal reflection plane at a lateral side thereof. If such is the case, preferably more than 90% of the region of the total internal reflection plane located within the reach of the seeping evanescent light has angles as defined above relative to the corresponding surfaces of the active layer.

It is also preferable that the above requirements of $\theta_1$ and $\theta_2$ are met over the entire peripheral surface of the low refractive index layers. In the case of a barrel-like profile, which may be hollow and cylindrical, it is preferable that the inner peripheral surface of the laser also meets the above requirements of $\theta_1$ and $\theta_2$.

The surface precision (surface coarseness) of the lateral surfaces of the low refractive index layers sandwiching the active layer 301 is preferably less than ½ of the wavelength of the laser beams within the medium of the active layer [(wavelength in vacuum)/(effective refractive index of medium)], more preferably less than ⅓ of the wavelength. More specifically, in the case of an InGaAsP type medium (wavelength: 1.55 μm, effective refractive index of medium: 3.6), the surface precision of the lateral surfaces of the low refractive index layers is preferably less than about 0.22 μm, more preferably less than 0.14 μm.

In the case of a AlGaAs type medium (wavelength: 0.85 μm, effective refractive index of medium: 3.6), it is preferably less than about 0.12 μm, preferably less than 0.08 μm.

The term "surface precision" refers to the flatness of the lateral surfaces of the layers. If the semiconductor laser has a cylindrical profile, it may be regarded to be as displacement from a real circle. It may be needless to say that not only the lateral surfaces of the low refractive index layers but also the lateral surface of the active layer preferably meet the above requirements.

(Filling of Hollow Cylindrical Pillar-like Section)

The hollow cylindrical pillar-like section (barrel-like section) is preferably filled with an insulating material (dielectric thin film). It may be needless to say that the filling material is not limited to an insulating material if the cylindrical section operates in a desired way and the hollow space of the cylindrical section does not have to be entirely filled with such a material.

Figure 10:
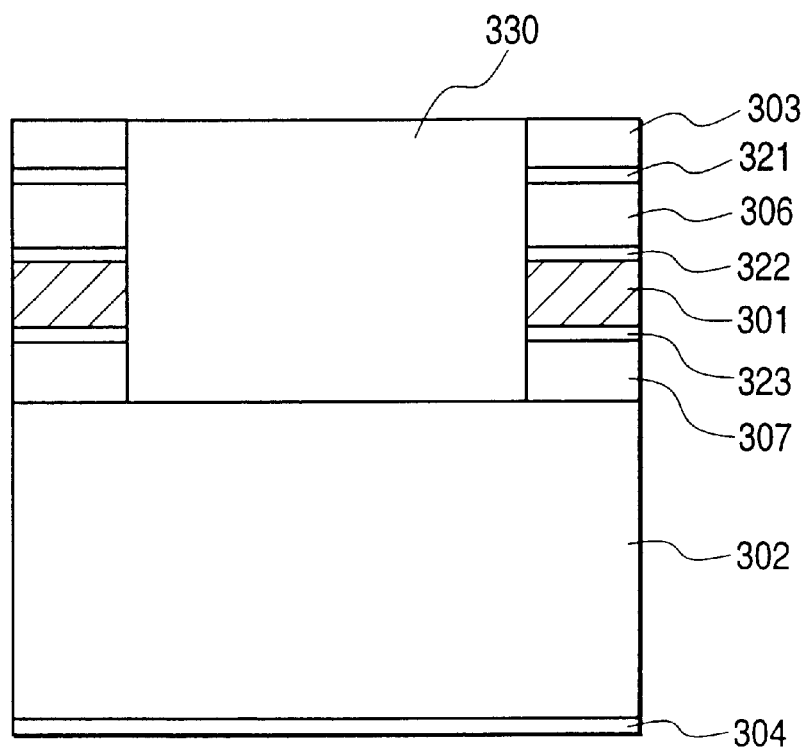
FIG. 10 is still another schematic cross sectional view of the first embodiment of a gyro comprising a ring resonator type semiconductor laser according to the invention.
Figure 11:
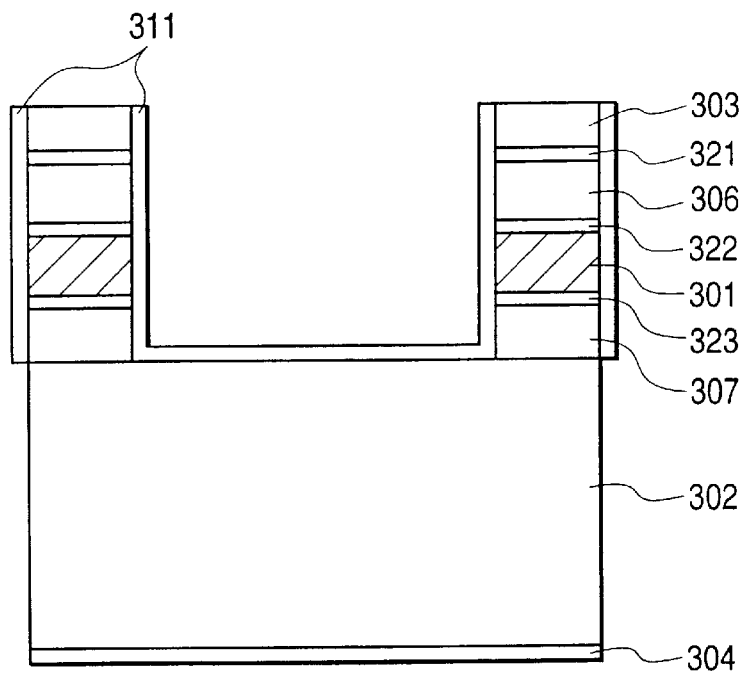
FIG. 11 is still another schematic cross sectional view of the first embodiment of a gyro comprising a ring resonator type semiconductor laser according to the invention.

While there is no limitation to the material of the dielectric film so long as it shows a specific resistance higher than the cladding layers, materials that can suitably be used for the purpose of the invention include amorphous Si, $SiO_2$, MgO and SiN. A total internal reflection plane may be formed in the inside of the hollow cylindrical section by means of the filling material. For the purpose of the invention, the hollow cylindrical section may be filled with a single material 330 or with a mixture of two or more than two materials as shown in FIG. 10. It is preferable that at least the inner or outer lateral surface of the active layer is coated with a thin film 311 as shown in FIG. 11. Then, the performance of the semiconductor laser is prevented from being degraded due to exposure to the external atmosphere. Additionally, this arrangement can save the material if compared with the arrangement of entirely filling the hollow cylindrical section. While the lateral surfaces are coated with a single film in FIG. 11, they may be alternatively coated with two or more than two film layers.

When using two or more than two dielectric film layers, a multilayer structure comprising a plurality of pairs of $SiO_2$ and Si layers is a preferable choice. As pointed out above, it is not necessary to entirely fill the inside of the hollow cylindrical section if the semiconductor laser operates in a desired way.

Now, another filling technique that can be used for the purpose of the invention will be described below.

Figure 12:
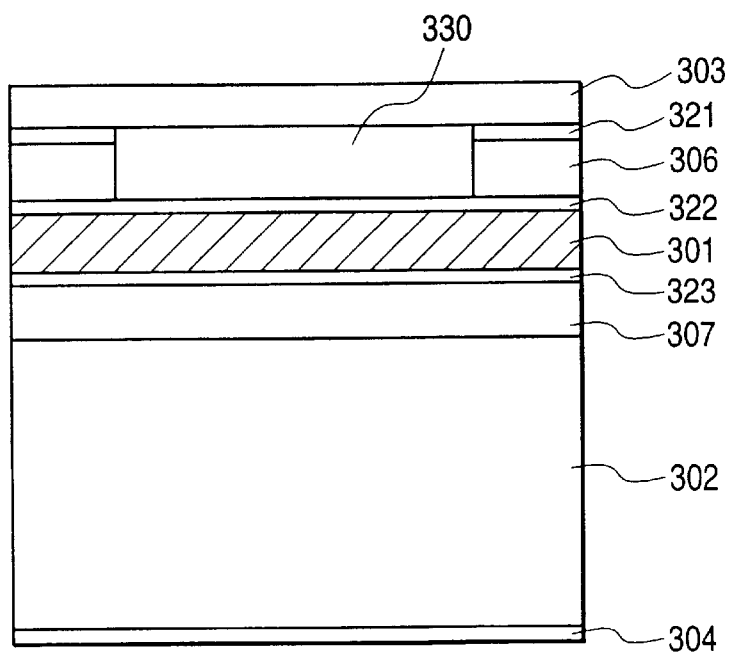
FIG. 12 is still another schematic cross sectional view of the first embodiment of a gyro comprising a ring resonator type semiconductor laser according to the invention.

Referring to FIG. 12, reference numeral 330 denotes an insulating film. It is also desirable to provide an insulating film region 330 under the central portion of the anode 303 as shown in FIG. 12. With this arrangement, it is difficult for any electric current to flow through the central region of the semiconductor laser so that the flow rate of the unreactive current will be reduced and a single transverse mode will be easily realized. This arrangement is advantageous when the anode electrode should be made to show a flat profile.

While no cap layer nor guiding layer are illustrated, they may be arranged whenever necessary.

When the upper cladding layer 306 is of the P-type, the insulating film 330 may be replaced by a PNP-type conductive material 330 for filling the hollow cylindrical section. Then, the central region of the semiconductor laser shows a PNPN thyristor structure to make it difficult for any electric current to flow therethrough.

Figure 13:
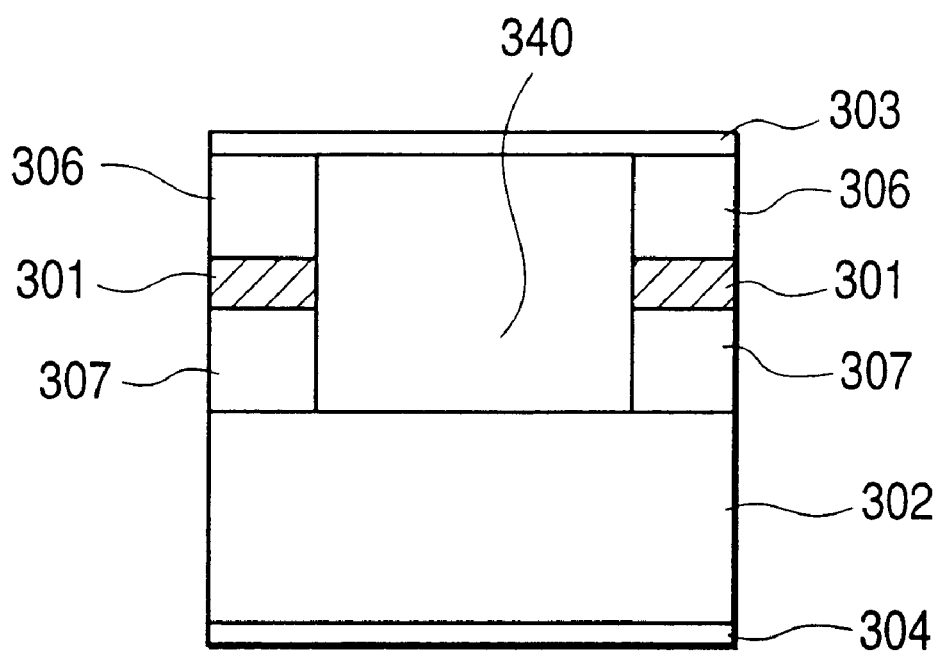
FIG. 13 is still another schematic cross sectional view of the first embodiment of a gyro comprising a ring resonator type semiconductor laser according to the invention.

FIG. 13 is a schematic cross sectional view of an embodiment of semiconductor laser having a cylindrical profile. In FIG. 13, reference numeral 340 denotes, for example, a Fe-doped high resistivity layer. A semiconductor laser according to the invention can be made to have a central region where any electric current can hardly flow by using such a high resistivity layer.

(Size of Hollow Cylindrical Pillar-like Section)

It is sufficient for the hollow cylindrical pillar-like section 309 of the active layer of a semiconductor laser according to the invention as shown in FIG. 9 to be located roughly in a central area. A state where no guided mode exists is referred to as cutoff state and it is desirable that the hollow cylindrical pillar-like section is so configured as to meet the requirements of a cut off state relative to higher order modes in order to stabilize the transverse mode. It is also desirable that the diameter d (FIG. 5) of the hollow cylindrical pillar-like section is so selected as to meet the requirements of a cutoff state relative to higher order modes.

By meeting the requirements of a cut off state relative to higher order modes, the transverse mode is reduced to a fundamental mode in favor of stabilization.

(Shape of Hollow Cylindrical Pillar-like Section)

The shape of the hollow cylindrical pillar-like section is not limited to a circular profile. It is preferable that the hollow cylindrical pillar-like section is made to show a hollow pillar-like profile that meets the requirements of a cut off state relative to higher order modes and, at the same time, allows the existence of a single guided mode (single transverse mode).

(Preparation of Hollow Cylindrical Pillar-like Section)

A semiconductor laser having a hollow cylindrical profile can be prepared by using a mask during the process of forming semiconductor film layers including an active layer, guiding layers and cladding layers on a substrate. Alternatively, a hollow cylindrical profile can be produced by forming an active layer, guiding layers and cladding layers by deposition to a cylindrical pillar-like shape and subsequently etching the inside.

Techniques that can be used for preparing the hollow cylindrical pillar-like section of a semiconductor laser according to the invention include wet etching, gas etching, plasma etching, sputter etching, reactive ion etching (RIE) and reactive ion beam etching (RIBE).

(Active Layer and Other Layers)

Materials that can be used for the active layer of a semiconductor laser according to the invention include GaAs, InP, ZnSe, AlGaAs, InGaAsP, InGaAlP, InGaAsP, GaAsP, InGaAsSb, AlGaAsSb, InAsSbP, PbSnTe, GaN, GaAlN, InGaN, InAlGaN, GaInP, GaInAs and SiGe.

The above listed materials can also be used for the clad layers.

Combinations of materials that can be used for the active layer and the cladding layers include PbSnTe (active layer)/PbSeTe (cladding layer), PbSnSeTe (active layer)/PbSeTe (cladding layer), PbEuSeTe (active layer)/PbEuSeTe (cladding layer), PbEuSeTe (active layer)/PbTe (cladding layer), InGaAsSb (active layer)/GaSb (cladding layer), AlInAsSb (active layer)/GaSb (cladding layer), InGaAsP (active layer)/InP (cladding layer), AlGaAs (active layer)/AlGaAs (cladding layer) and AlGaInP (active layer)/AlGaInP (cladding layer).

In terms of the structure of a semiconductor laser according to the invention, the active layer is not limited to the bulk structure and may alternatively use a single quantum well (SQW) structure or a multiple quantum well (MQW) structure.

When a quantum well type laser is used, it can preferably show a strained quantum well type structure. If such is the case, the active layer is formed by using eight InGaAsP quantum well layers having an about 1% compression strain and an InGaAsP barrier layer.

Alternatively, an MIS structure may be used for the purpose of the invention.

(Substrate)

A substrate of any type on which desired materials can be grown may be used for the purpose of the invention. Substrates that can be used for the purpose of the invention include compound semiconductor substrates such as a GaAs substrate, an InP substrate, a GaSb substrate, an InAs substrate, a PbTe substrate, a GaN substrate, a ZnSe substrate and a ZnS substrate in addition to an SiC substrate, a 4H—SiC substrate, a 6H—SiC substrate, a sapphire substrate, a silicon substrate and an SOI substrate.

(Forming Technique)

Techniques that can be used for forming the active layer or other layers of a semiconductor laser according to the invention include the liquid phase epitaxy method (LPE method), the molecular beam epitaxy method (MBE method), the metal organic vapor phase growth method (MOCVD method, MOVPE method), the atomic layer epitaxy method (ALE method), metal organic molecular beam epitaxy method (MOMBE method) and chemical beam epitaxy method (CBE method).

(Electrode Material)

Materials that can be used for the anode of a semiconductor laser according to the invention include non-limitatively Cr/Au, Ti/Pt/Au and AuZn/Ti/Pt/Au. Materials that can be used for the cathode of a semiconductor laser according to the invention include AuGe/Ni/Au and AuSn/Mo/Au but not limited thereto.

The electrodes may be arranged inversely relative to the illustrated arrangement depending on the conductivity of the substrate and that of the cap layer. This is true for the other embodiments.

According to a preferable arrangement of the electrodes, a cap layer (contact layer) is formed on the cladding layer in order to reduce the contact resistance relative to the electrodes and subsequently the electrode material is formed on the cap layer.

For example, an arrangement of InGaAsP (active layer)/P-type InP (cladding layer)/P-type InGaAsP (cap layer)/electrode may be used.

While it may appear that the cathode is arranged under the substrate in the drawings, the anode and the cathode may be arranged inversely depending on the conduction type of the substrate.

(Others)

In order to prevent any adverse effect of heat on the semiconductor laser according to the invention, a semiconductor laser chip may preferably be mounted on a heat emitting (heat sink) material. Heat sink materials that can be used for the purpose of the invention include non-limitatively Cu, Si, SiC, AlN and diamond. If necessary, a Peltier device may additionally be used to control the temperature of the unit.

For the purpose of reliably providing a semiconductor laser according to the invention with a total internal reflection plane and/or protecting it against degradation, an insulating film (coating film) may be formed on the lateral surface (in a region where light exists) of the semiconductor laser. Materials that can be used for the coating film include $SiO_2$, SiN, $Al_2O_3$, $Si_3N_4$ and other insulating materials and amorphous silicon ($\alpha$-Si).

By using the method described above in terms of the above embodiment, the change in the frequency of the electric current flowing through a semiconductor laser, the voltage applied to a semiconductor laser or the impedance of a semiconductor laser can be detected as beat signal so that the laser can be used for a gyro.

Embodiment 2

Figure 14:
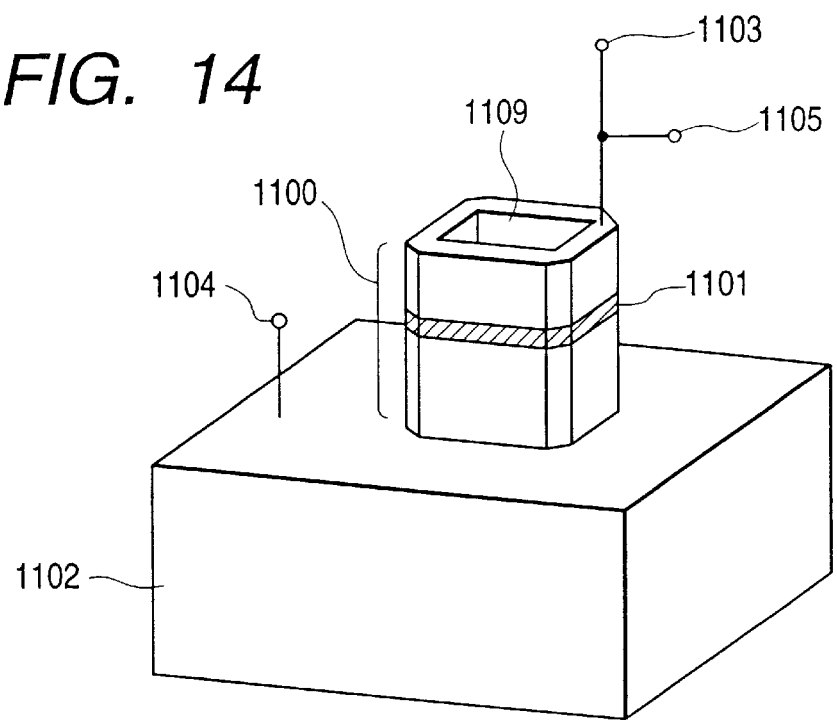
FIG. 14 is a schematic perspective view of the second embodiment of a gyro comprising a ring resonator type semiconductor laser according to the invention.

FIG. 14 is a schematic perspective view of another embodiment of gyro according to the invention comprising a ring resonator type laser adapted to have laser beams transmitted circularly. This embodiment differs from the first embodiment (FIG. 2) mainly in that the semiconductor laser of this embodiment has a hollow rectangular pillar-like profile.

In FIG. 14, there are shown a semiconductor laser 1100, an active layer 1101, a substrate 1102, an anode 1103 and a cathode 1104. Reference number 1105 denotes an electric terminal.

With this arrangement, the second embodiment provides an effect similar to that of the first embodiment and, at the same time, the number of oscillation modes is reduced to improve the S/N ratio if compared with the first embodiment because the propagation mode is reduced.

Figure 15:
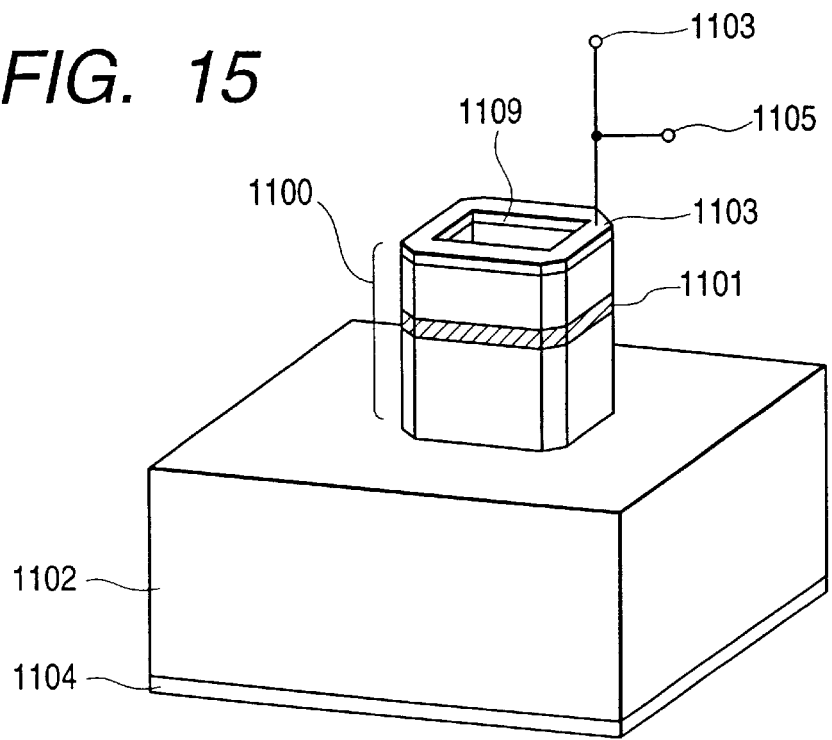
FIG. 15 is another schematic perspective view of the second embodiment of a gyro comprising a ring resonator type semiconductor laser according to the invention.

The locations and the configuration of the electrodes are not limited to those of FIG. 14. FIG. 15 shows an embodiment obtained by modifying the embodiment of FIG. 14 particularly in terms of the configuration and the locations of the electrodes.

Figure 16:
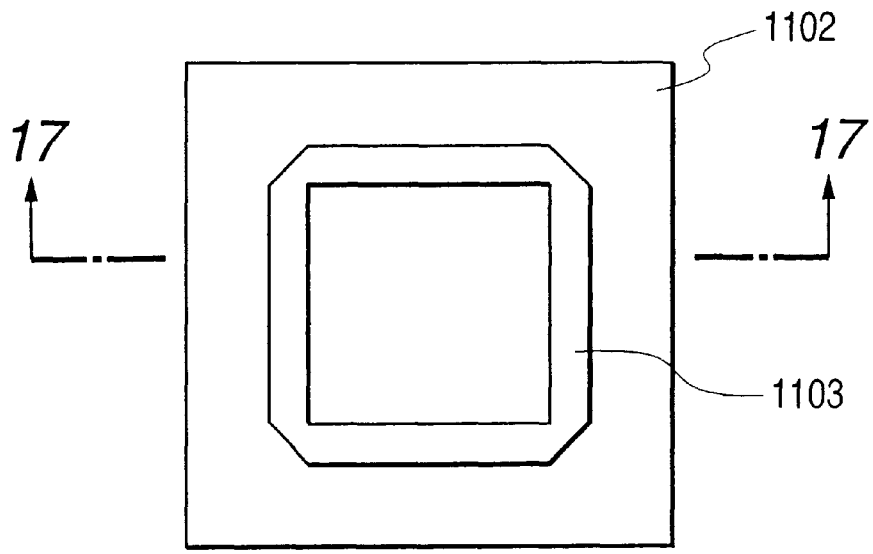
FIG. 16 is a schematic plan view of the second embodiment of a gyro comprising a ring resonator type semiconductor laser according to the invention.

FIG. 16 is a schematic plan view of the embodiment of semiconductor laser of FIG. 15.

Figure 17:
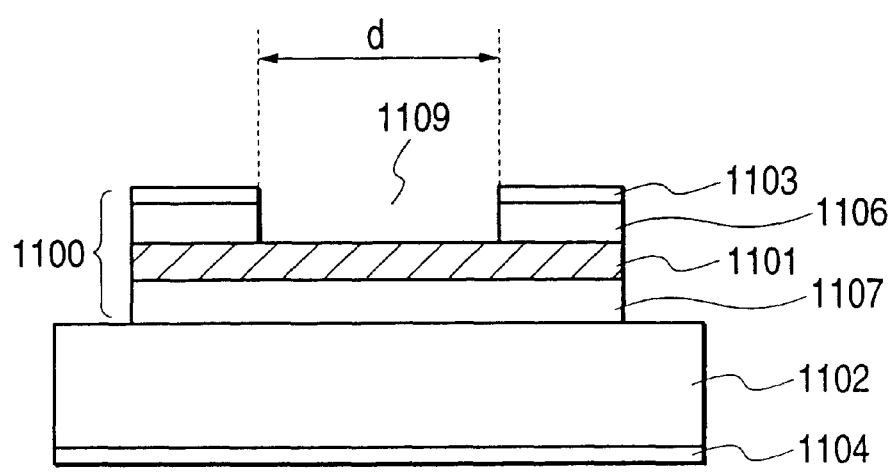
FIG. 17 is a schematic cross sectional view of the second embodiment of a gyro comprising a ring resonator type semiconductor laser according to the invention.

FIG. 17 is a schematic cross sectional view of the semiconductor laser of FIG. 16 taken along line 17—17 in FIG. 16. In FIG. 17, there are shown a semiconductor laser 1100, an active layer 1101, a substrate 1102, an anode 1103, a cathode 1104, an upper cladding layer 1106 and a lower cladding layer 1107.

By hollowing at least the upper cladding layer 1106 at a central region thereof to produce a hollow rectangular pillar-like profile 1109, the central region of the semiconductor laser tends to obstruct the electric current flowing therethrough. Thus, this arrangement allows only the laser beams being transmitted circularly to get a gain so as to reduce any inactive electric current. Particularly, the beat frequency will be highly stabilized when a single transverse mode is realized.

Figure 18:
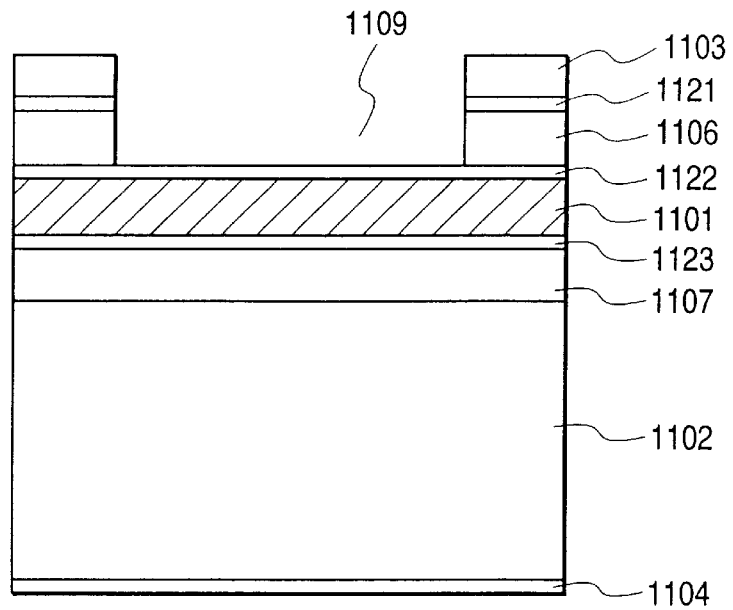
FIG. 18 is another schematic cross sectional view of the second embodiment of a gyro comprising a ring resonator type semiconductor laser according to the invention.

Referring to FIG. 17, which does not particularly show a guiding layer and a cap layer, it is sufficient that at least the upper cladding layer 1106 is hollowed at a central region thereof for the purpose of the invention if such layers are present. FIG. 18 shows an arrangement where a cap layer 1121 and guiding layers 1122 and 1123 are present.

It is also possible for the purpose of the invention to arrange hollow rectangular pillar-like electrodes without modifying profile of the upper cladding layer and that of the cap layer.

Figure 19:
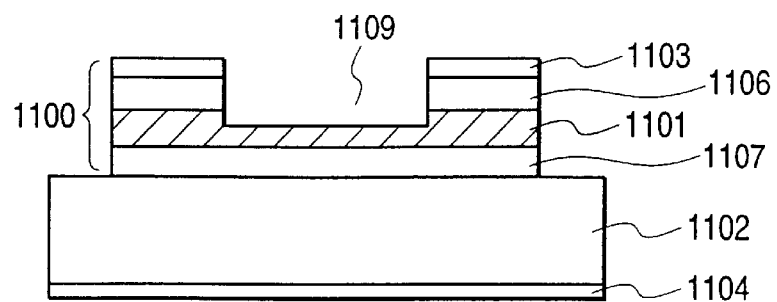
FIG. 19 is still another schematic cross sectional view of the second embodiment of a gyro comprising a ring resonator type semiconductor laser according to the invention.
Figure 20:
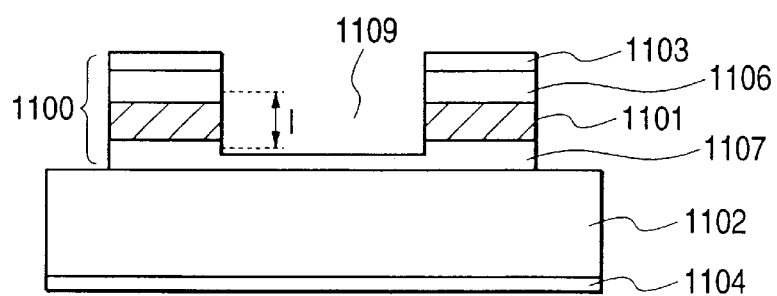
FIG. 20 is still another schematic cross sectional view of the second embodiment of a gyro comprising a ring resonator type semiconductor laser according to the invention.

It is also preferable that the active layer 1101 is at least partly made to have a hollow rectangular pillar-like profile as shown in FIG. 19. Alternatively, the lower cladding layer 1107 may be at least partly made to have a hollow rectangular pillar-like profile as shown in FIG. 20. When the active layer is partly made to show a hollow rectangular pillar-like profile, the threshold electric current can be reduced more effectively because the volume of the active layer is reduced.

Particularly, the presence of a hollow rectangular pillar-like profile is advantageous in a region within the reach of the seeping evanescent light (e.g., region with a height of l in FIG. 20). More specifically, it is preferable that the active layer shows a window frame-shaped profile.

If, for example, the reach l of the seeping evanescent light of an ordinary semiconductor laser is about 1 $\mu$m.

Figure 21:
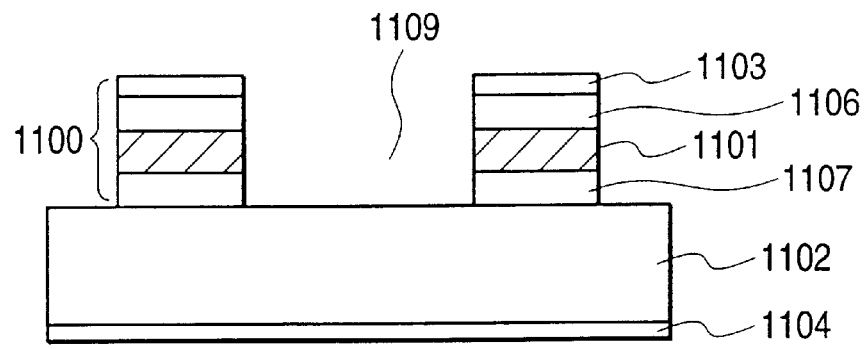
FIG. 21 is still another schematic cross sectional view of the second embodiment of a gyro comprising a ring resonator type semiconductor laser according to the invention.

Provided that the active layer has a constant thickness, the semiconductor laser can advantageously be driven with a low drive current when the semiconductor laser has a hollow 1109 within the reach of the seeping evanescent light in a direction perpendicular to the surface of the active layer, to raise the optical confinement factor of the active layer. Then, the oscillation frequency of semiconductor laser will be stabilized (and a single transverse mode is realized). Alternatively, the entire semiconductor laser 1100 may have a hollow rectangular pillar-like profile as shown in FIG. 21.

While the reach l of the seeping evanescent light is limited within the cladding layers 1106, 1107 in FIG. 20, it may alternatively go beyond the cladding layers depending on the refractive index and the thickness of the cladding layers. If such is the case, it is desirable that at least the portion of the semiconductor laser located within the reach l of the seeping evanescent light has a hollow rectangular pillar-like profile. If the seeping evanescent light gets to the guiding layers between the active layer and the respective cladding layers and even to the substrate 1102, it is also desirable that the guiding layers and the part of the substrate located within the reach l of the seeping evanescent light have a hollow rectangular pillar-like profile.

(Filling of Hollow Rectangular Pillar-like Section)

The hollow rectangular pillar-like section is preferably filled with an insulating material (dielectric thin film). It may be needless to say that the filling material is not limited to an insulating material if the rectangular section operates in a desired way and the hollow space of the rectangular section does not have to be entirely filled with such a material.

Figure 22:
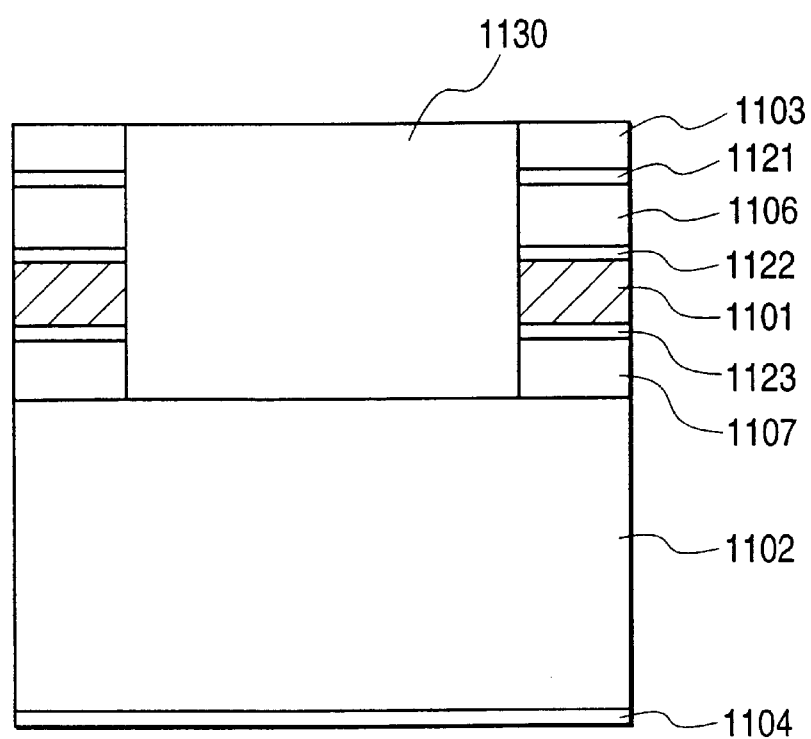
FIG. 22 is still another schematic cross sectional view of the second embodiment of a gyro comprising a ring resonator type semiconductor laser according to the invention.
Figure 23:
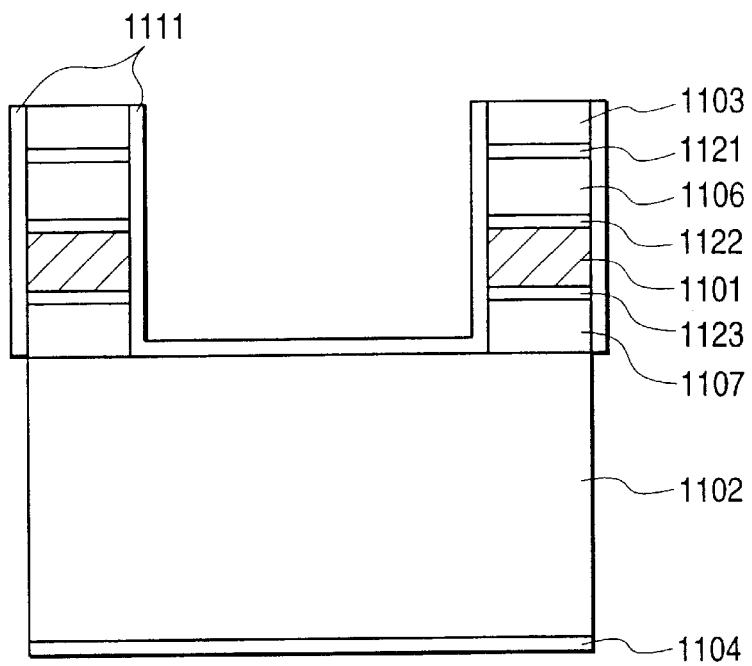
FIG. 23 is still another schematic cross sectional view of the second embodiment of a gyro comprising a ring resonator type semiconductor laser according to the invention.

While there is no limitation to the material of the dielectric film so long as it shows a specific resistance higher than the clad layers, materials that can suitably be used for the purpose of the invention include amorphous Si, $SiO_2$, MgO and SiN. A total internal reflection plane may be formed inside of the hollow rectangular section by means of the filling material. For the purpose of the invention, the hollow rectangular section may be filled with a single material 1130 or with a mixture of two or more than two materials as shown in FIG. 22. It is preferable that at least the inner or outer lateral surface of the active layer is coated with a thin film 1111 as shown in FIG. 23. Then, the performance of the semiconductor laser is prevented from being degraded due to exposure to the external atmosphere. Additionally, this arrangement can save the material if compared with the arrangement of entirely filling the hollow rectangular section. While the lateral surfaces are coated with a single film in FIG. 23, they may be alternatively coated with two or more than two film layers.

When using two or more than two dielectric film layers, a multilayer structure comprising plural pairs of $SiO_2$ and Si layers is a preferable choice. As pointed out above, it is not necessary to entirely fill the inside of the hollow rectangular section if the semiconductor laser operates in a desired way.

Now, another filling technique that can be used for the purpose of the invention will be described below.

Figure 24:
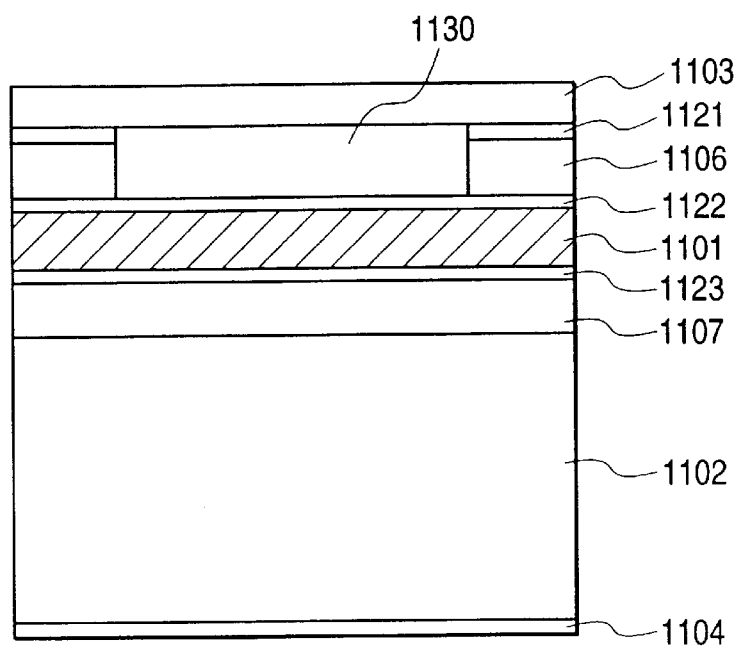
FIG. 24 is still another schematic cross sectional view of the second embodiment of a gyro comprising a ring resonator type semiconductor laser according to the invention.

Referring to FIG. 24, reference numeral 1130 denotes an insulating film. It is also desirable to provide an insulating film region 1130 under the central portion of the anode 1103 as shown in FIG. 24. With this arrangement, it is difficult for any electric current to flow through the central region of the semiconductor laser so that the flow rate of the inactive current will be reduced and a single transverse mode will be easily realized. This arrangement is advantageous when the anode electrode should be made to show a flat profile.

While no cap layer nor guiding layer are illustrated, they may be arranged whenever necessary.

When the upper cladding layer 1106 is of the P-type in FIG. 24, the insulating film 1130 may be replaced by a PNP-type conductive material 1130 for filling the hollow rectangular section. Then, the central region of the semiconductor laser shows a PNPN thyristor structure to make it difficult for any electric current to flow therethrough.

Figure 25:
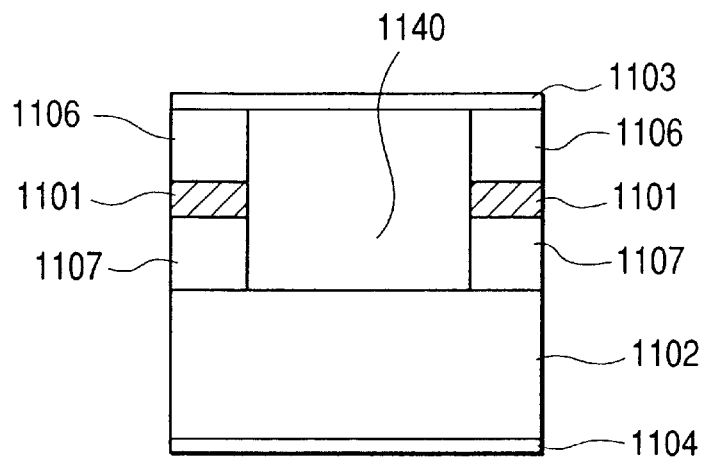
FIG. 25 is still another schematic cross sectional view of the second embodiment of a gyro comprising a ring resonator type semiconductor laser according to the invention.

FIG. 25 is a schematic cross sectional view of an embodiment of semiconductor laser having a rectangular profile. In FIG. 25, reference numeral 1140 denotes a Fe-doped high resistivity layer. A semiconductor laser according to the invention can be made to have a central region where any electric current can hardly flow by using such a high resistivity layer.

(Size of Hollow Rectangular Pillar-like Section)

It is sufficient for the hollow rectangular pillar-like section 1109 of the active layer of a semiconductor laser according to the invention to be located roughly in a central area. A state where guided mode does not exist is referred to as cutoff state and it is desirable that the hollow rectangular pillar-like section is so configured as to meet the requirements of a cutoff state relative to higher order modes in order to stabilize the transverse mode. It is also desirable that the diameter d (FIG. 17) of the hollow rectangular pillar-like section is so selected as to meet the requirements of a cutoff state relative to higher order modes. By meeting the requirements of a cut off state relative to a mode of higher order, the transverse mode is reduced to a fundamental mode in favor of stabilization.

(Shape of Hollow Rectangular Pillar-like Section)

The shape of the hollow rectangular pillar-like section is not limited to a square profile. It is preferable that the hollow rectangular pillar-like section is made to show a hollow pillar-like profile that meets the requirements of a cutoff state relative to higher order modes and, at the same time, allows the existence of a single guided mode (single transverse mode).

(Preparation of Hollow Rectangular Pillar-like Section)

A semiconductor laser having a hollow rectangular profile can be prepared by using a mask during the process of forming semiconductor film layers including an active layer, guiding layers and cladding layers. Alternatively, a hollow rectangular profile can be produced by forming an active layer, guiding layers and cladding layers by deposition to a rectangular pillar-like shape and subsequently etching the inside.

The techniques cited above by referring to the first embodiment can also be used for preparing the hollow rectangular pillar-like section of a semiconductor laser according to the invention.

The arrangement of the active layer and the configuration of the semiconductor laser as described above by referring to the first embodiment can also be applied to this embodiment.

The active layer of the semiconductor laser of this embodiment can be prepared as in the case of the first embodiment.

The anode and the cathode as sell as the substrate of this embodiment may be like those of the first embodiment.

The materials listed above for the heat sink of the first embodiment can also be used for this embodiment.

Embodiment 3

Figure 26:
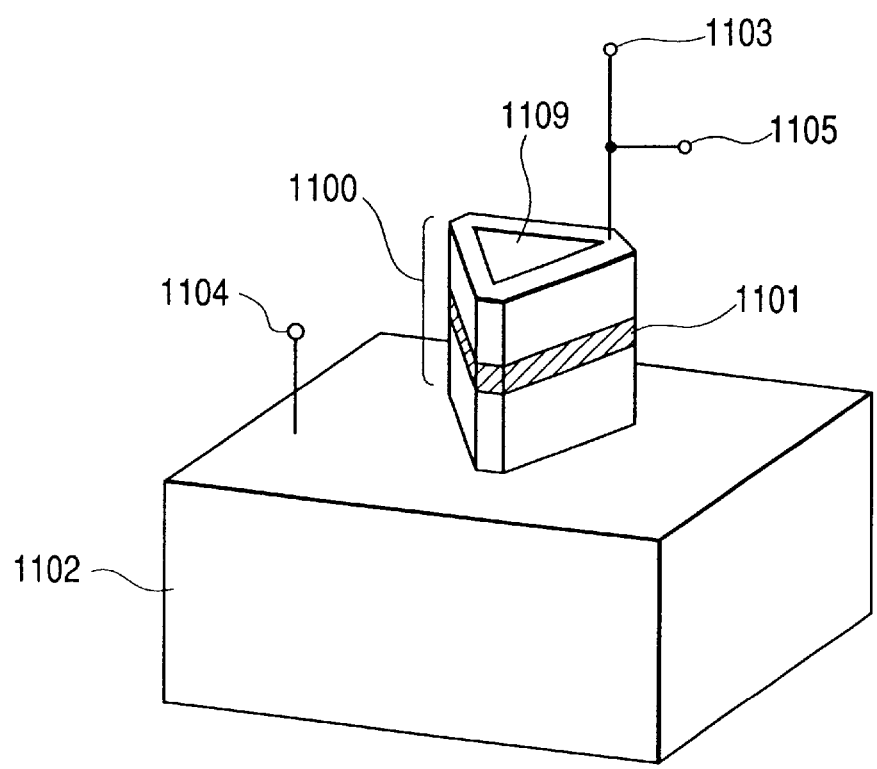
FIG. 26 is a schematic perspective view of the third embodiment of a gyro comprising a ring resonator type semiconductor laser according to the invention.

FIG. 26 is a schematic perspective view of a third embodiment of the invention and shows a gyro comprising a ring resonator type laser adapted to have laser beams transmitted circularly. This embodiment differs from the first and second embodiments mainly in that the semiconductor laser of this embodiment has a hollow triangular pillar-like profile.

With this arrangement, the third embodiment provides an effect similar to that of the first embodiment and, at the same time, the number of oscillation modes is reduced to improve the S/N ratio if compared with the first embodiment because the propagation mode is reduced.

The hollowed structure of a central region, its profile, location and depth and the techniques that can be used for filling the hollowed section as described above by referring to the first and second embodiments can also be applied to this embodiment.

Embodiment 4

Figure 27:
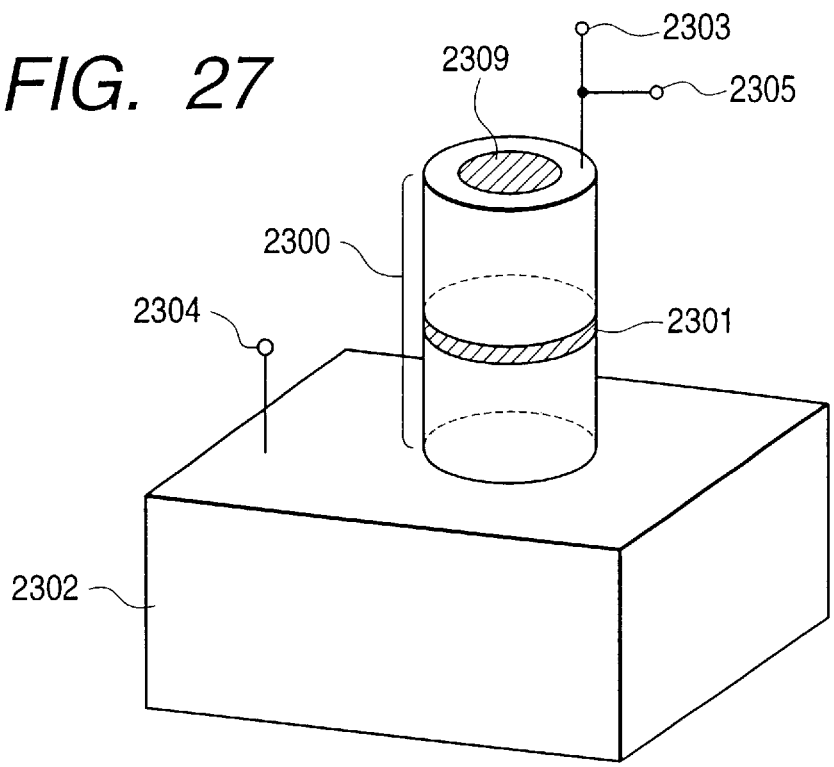
FIG. 27 is a schematic perspective view of the fourth embodiment of a gyro comprising a ring resonator type semiconductor laser according to the invention.

FIG. 27 is a schematic perspective view of another embodiment of gyro according to the invention and comprising a ring resonator type laser adapted to have laser beams transmitted circularly. In FIG. 27, there are shown a semiconductor laser 2300, an active layer 2301, a substrate 2302, an anode 2303 and a cathode 2304. Reference number 2305 denotes an electric terminal. While not indicated by any reference numerals, at least a pair of low refractive index layers (cladding layers) are arranged respectively on and under the active layer 2301. Reference numeral 2309 denotes a high resistivity region produced by ion implantation. While a guiding layer and a cap layer are omitted from FIG. 27, guiding layers may be formed between the active layer and the respective cladding layers. Additionally, a cap layer may be formed between each cladding layer and the corresponding electrode as buffer layer. While the anode 2303 is made to show a ring-like profile and the high resistivity region 2309 is exposed in FIG. 27, the region 2309 may be entirely covered by the anode 2303. The positions of the electrodes are not limited to those shown in FIG. 27. They may alternatively be arranged at positions as shown in FIG. 28.

Figure 28:
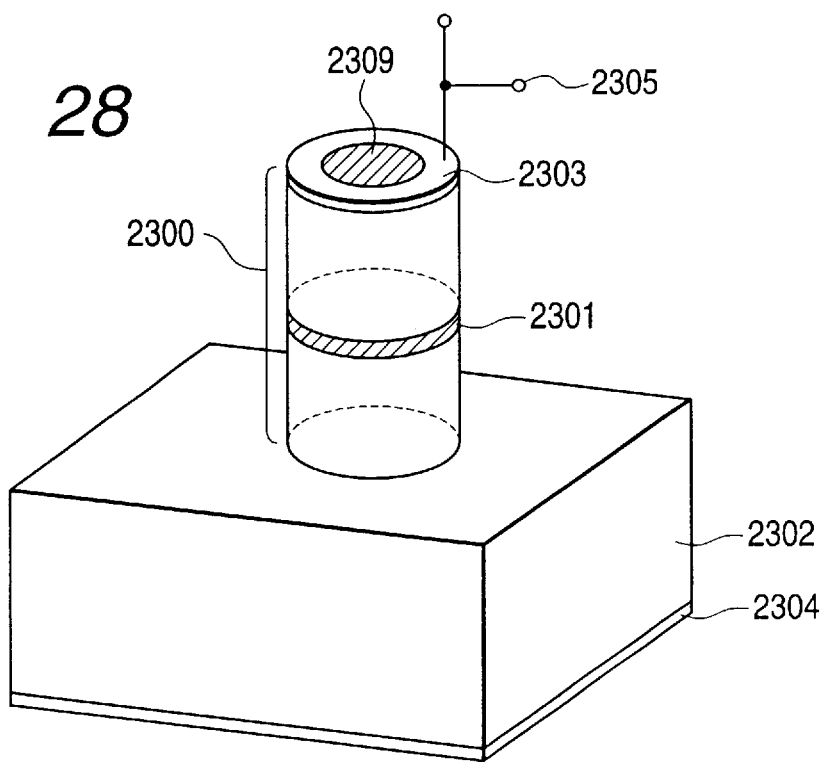
FIG. 28 is another schematic perspective view of the fourth embodiment of a gyro comprising a ring resonator type semiconductor laser according to the invention.
Figure 29:
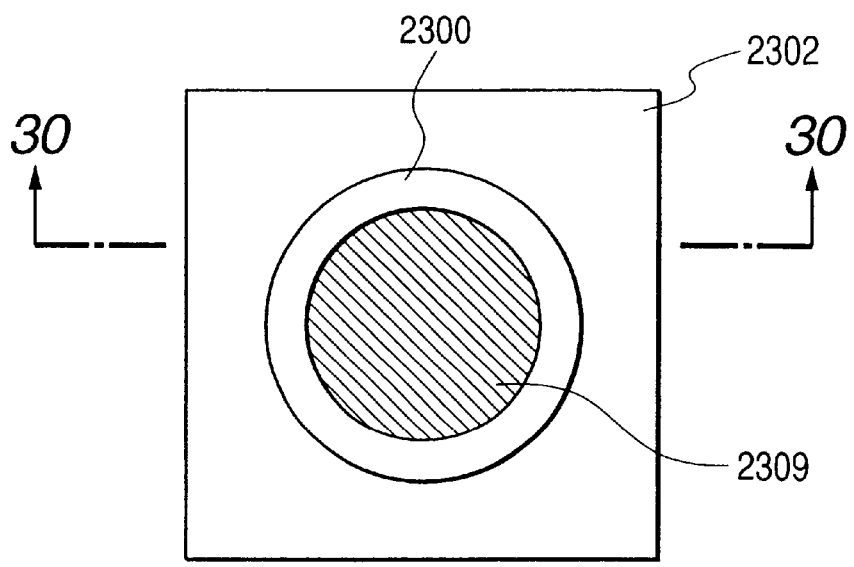
FIG. 29 is a schematic plan view of the fourth embodiment of a gyro comprising a ring resonator type semiconductor laser according to the invention.

FIG. 29 is a schematic plan view of the semiconductor laser of FIG. 28.

Figure 30:
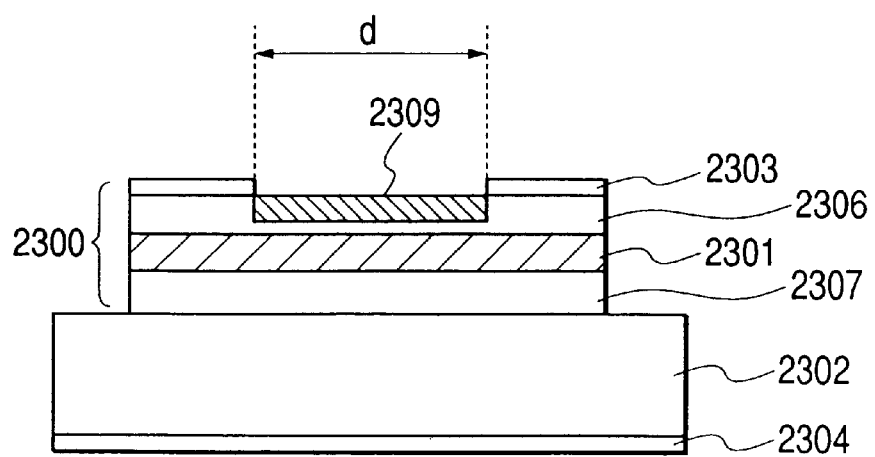
FIG. 30 is a schematic cross sectional view of the fourth embodiment of a gyro comprising a ring resonator type semiconductor laser according to the invention.

FIG. 30 is a schematic cross sectional view of the semiconductor laser of FIG. 29 taken along line 30—30 in FIG. 29. In FIG. 30, there are shown an active layer 2301, a substrate 2302, an anode 2303, a cathode 2304, an upper cladding layer 2306 and a lower cladding layer 2307. Reference numeral 2309 is a high resistivity region produced by ion implantation. With this arrangement, the central region of the semiconductor laser tends to obstruct the electric current flowing therethrough. Thus, this arrangement allows only the laser beams being transmitted circularly to get a gain so as to reduce any inactive electric current.

Figure 56:
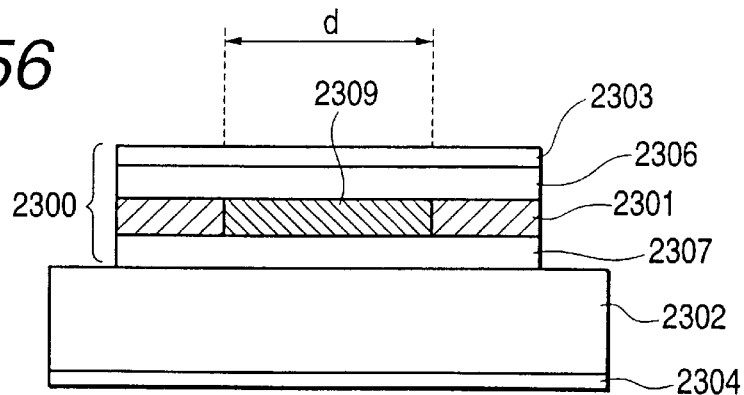
FIG. 56 is a schematic cross sectional view of an embodiment of semiconductor laser according to the invention.

While the boundary of the high resistivity region 2309 is clearly defined with a line in FIG. 30, it actually has a certain width and may be somewhat blurred. The operation of ion implantation is preferably conducted in such a way that the projection range of ion implantation is mainly found within the active layer as shown in FIG. 56.

While it may be seen from FIG. 30 that at least part of the upper cladding layer is made to show a high resistivity, part of the active region 2301 and at least part of the lower cladding layer 2307 may also be made to show a high resistivity so long as at least part of the upper cladding layer is made to show a high resistivity. It may be needless to say that the entire central region of the semiconductor laser may be made to show a high resistivity.

In particular, the volume of the active layer can be substantially reduced to decrease the driving current if a central region of the active layer 2301 is made to show a high resistivity.

It is also possible to carry out the option of ion implantion in such a way that the projection range of ion implantation is mainly found in a region within the active layer so that mainly the region is made to show a high resistivity.

While the anode 2303 is arranged on the peripheral portion of the semiconductor laser in FIG. 30, it may alternatively be arranged on the top of the laser to entirely cover the top.

Guiding layers and cap layers may also be arranged appropriately.

The expression of "high resistivity" as used for the purpose of the present invention refers to a specific resistance between 100 Ω·cm and $10^5$ Ω·cm, preferably between $5\times10^3$ Ω·cm and $1\times10^5$ Ω·cm in the region implanted with ions, although the values may vary depending on the type of the active layer.

Preferable ions to be used for ion implantation for the purpose of the invention include protons and boron ions.

The operation of ion implantation is preferably conducted in such a way that the projection range Rp of ion implantation is found at the center of the active layer. The acceleration voltage to be used for the ion implantation is preferably found between 10 KeV and 1 MeV depending on the materials and the thicknesses of the cladding layer and the guiding layer on the active layer.

The rate of ion implantation is between $1\times10^{13}$ cm$^{-2}$ and $1\times10^{15}$ cm$^{-2}$ for the purpose of the present invention.

The substrate to be used for the ion implantation may be held at room temperature.

It is not necessary to implant ions rigorously to the center of the semiconductor laser. However, it is desirable that ions are implanted substantially in a central region of the active layer so as to meet the requirements of a cutoff state relative to higher order modes.

It is also desirable that the diameter d of the region of ion implantation is so selected as to meet the requirements of a cutoff state relative to higher degree modes.

The contour of the region of ion implantation is not limited to circular and it may have an appropriate form that meets the requirements of a cutoff state where a single guided mode exists (and realize a single transverse mode).

Preferably, after the ion implantation, the semiconductor laser is subjected to an annealing process in order to reduce the damage produced during the ion implantation operation. The annealing process is conducted at temperature between 200° C. and 500° C., preferably between 300° C. and 400° C. in a hydrogen-containing atmosphere.

The arrangement of the active layer and the configuration of the semiconductor laser as described above by referring to the first embodiment can also be applied to this embodiment.

The active layer of the semiconductor laser of this embodiment can be prepared as in the case of the first embodiment.

The anode and the cathode as well as the substrate of this embodiment may be like those of the first embodiment.

The materials listed above for the heat sink of the first embodiment can also be used for this embodiment.

While the technique of ion implantation is used to raise the resistivity of a central region in this embodiment, such a high resistivity area can be produced by selectively oxidizing the selected area.

Embodiment 5

Figure 31:
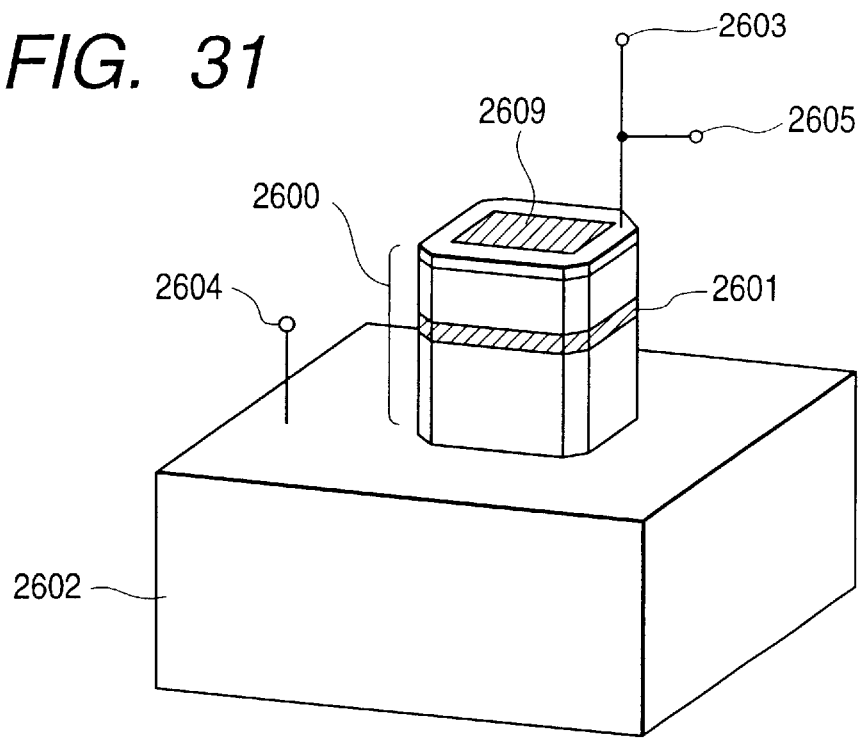
FIG. 31 is a schematic perspective view of the fifth embodiment of a gyro comprising a ring resonator type semiconductor laser according to the invention.

FIG. 31 is a schematic perspective view of still another embodiment of gyro according to the invention and comprising a ring resonator type laser adapted to have laser beams transmitted circularly. In FIG. 31, there are shown a semiconductor laser 2600, an active layer 2601, a substrate 2602, an anode 2603 and a cathode 2604. Reference number 2605 denotes an electric terminal. While not indicated by any reference numbers, at least a pair of low refractive index layers (cladding layers) are arranged respectively on and under the active layer 2601. Reference numeral 2609 denotes a high resistivity region produced by ion implantation. While a guiding layer and a cap layer are omitted from FIG. 31, guiding layers may be formed between the active layer and the respective cladding layers. Additionally, a cap layer may be formed between each cladding layer and the corresponding electrode as buffer layer. While the anode 2603 is made to show a ring-like profile and the high resistivity region 2609 is exposed in FIG. 31, the region 2609 may be entirely covered by the anode 2603. The positions of the electrodes are not limited to those shown in FIG. 31. They may alternatively be arranged at positions as shown in FIG. 32.

Figure 32:
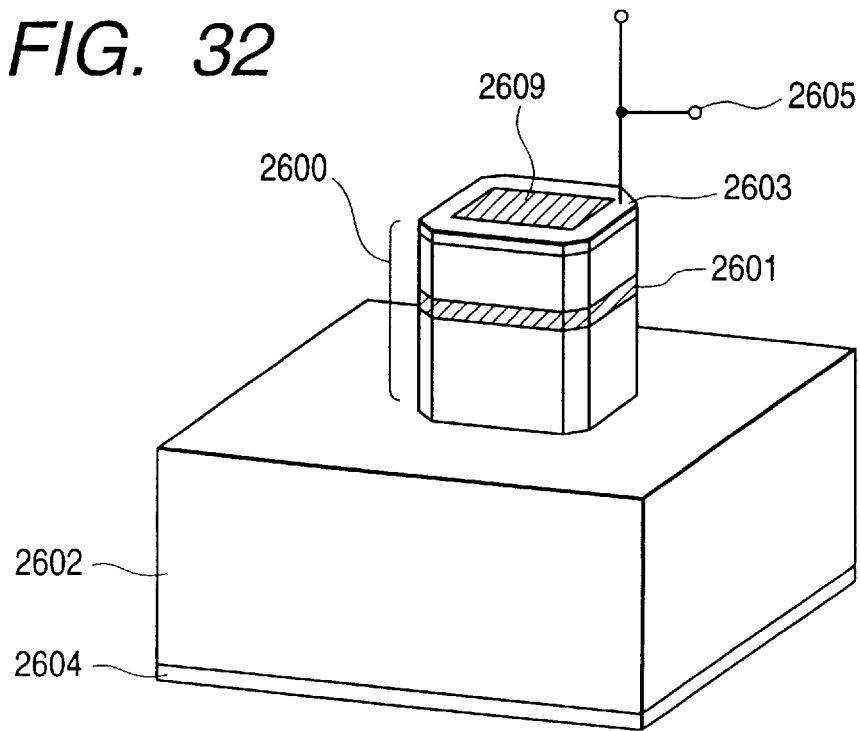
FIG. 32 is another schematic perspective view of the fifth embodiment of a gyro comprising a ring resonator type semiconductor laser according to the invention.
Figure 33:
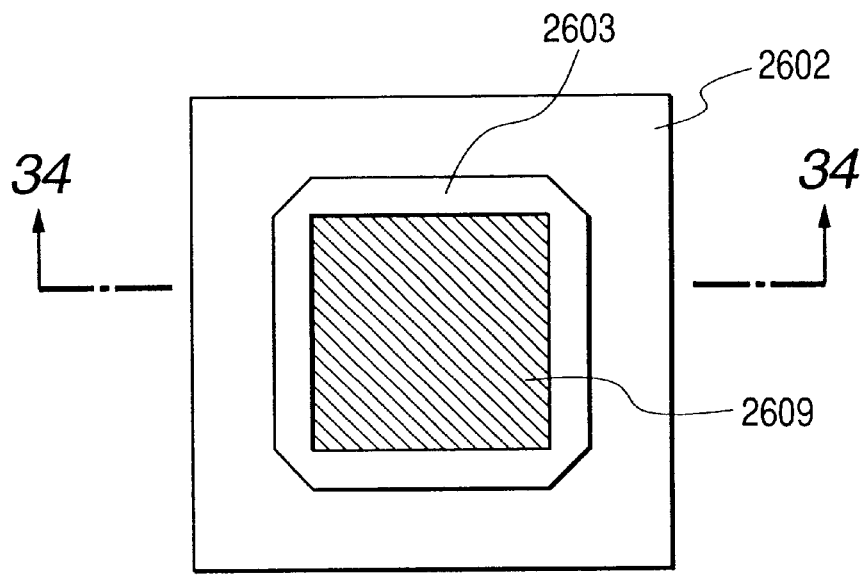
FIG. 33 is a schematic plan view of the fifth embodiment of a gyro comprising a ring resonator type semiconductor laser according to the invention.

FIG. 33 is a schematic plan view of the semiconductor laser of FIG. 32.

Figure 34:
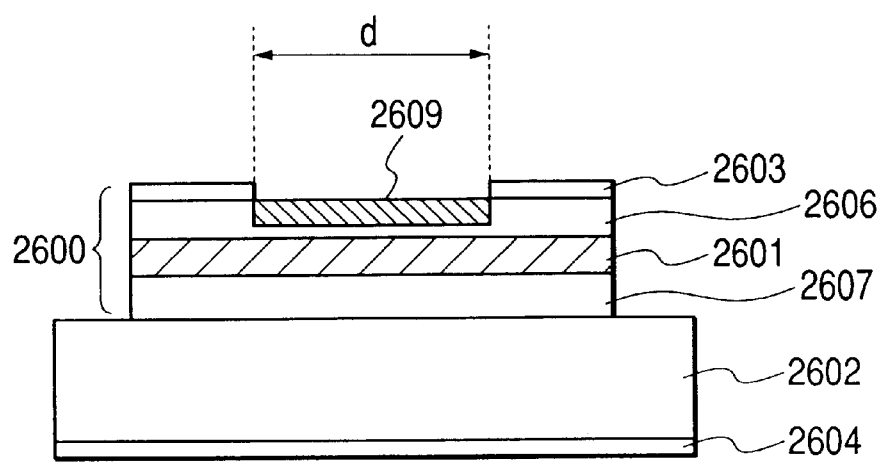
FIG. 34 is a schematic cross sectional view of the fifth embodiment of a gyro comprising a ring resonator type semiconductor laser according to the invention.

FIG. 34 is a schematic cross sectional view of the semiconductor laser of FIG. 33 taken along line 34—34 in FIG. 33. In FIG. 34, there are shown an active layer 2601, a substrate 2602, an anode 2603, a cathode 2604, an upper cladding layer 2606 and a lower cladding layer 2607. Reference numeral 2609 is a high resistivity region produced by ion implantation. With this arrangement, the central region of the semiconductor laser tends to obstruct the electric current flowing therethrough. Thus, this arrangement allows only the laser beams being transmitted circularly to get a gain so as to reduce any inactive electric current.

While the boundary of the high resistivity region 2609 is clearly defined with a line in FIG. 34, it actually has a certain width and may be somewhat blurred.

While it may be seen from FIG. 34 that at least part of the upper cladding layer is made to show a high resistivity, part of the active region 2601 and at least part of the lower cladding layer 2607 may also be made to show a high resistivity so long as at least part of the upper cladding layer is made to show a high resistivity. It may be needless to say that the entire central region of the semiconductor laser may be made to show a high resistivity.

In particular, the volume of the active layer can be substantially reduced to decrease the driving current if a central region of the active layer 2601 is made to show a high resistivity.

It is also possible to carry out the option of ion implantion in such a way that the projection range of ion implantation is mainly found in a region within the active layer so that mainly the region is made to show a high resistivity.

While the anode 2603 is arranged on the peripheral portion of the semiconductor laser in FIG. 34, it may alternatively be arranged on the top of the laser to entirely cover the top.

Guiding layers and cap layers may also be arranged appropriately.

The components and the processes used in the first embodiments may also be applied to this embodiment.

The description made above on the structure of the semiconductor laser by referring to the first embodiment is also applicable to this embodiment.

Similarly, the description made above on the substrate by referring to the first embodiment is also applicable to this embodiment.

The arrangement of the active layer as described above by referring to the first embodiment can also be applied to this embodiment.

The active layer of the semiconductor laser of this embodiment can be prepared as in the case of the first embodiment.

The anode and the cathode of this embodiment may be like those of the first embodiment.

The materials listed above for the heat sink of the first embodiment can also be used for this embodiment.

Embodiment 6

Figure 35:
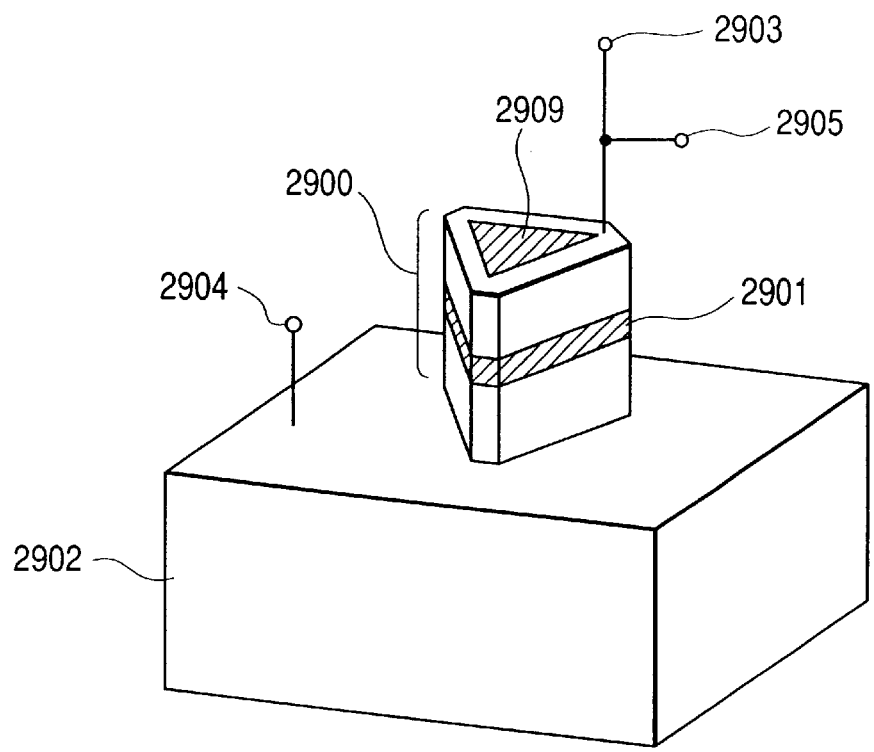
FIG. 35 is a schematic perspective view of the sixth embodiment of a gyro comprising a ring resonator type semiconductor laser according to the invention.

FIG. 35 is a schematic perspective view of still another embodiment of gyro according to the invention and comprising a ring resonator type laser adapted to have laser beams transmitted circularly. This embodiment differs from the fourth and fifth embodiments mainly in that the semiconductor laser of this embodiment has a triangular pillar-like profile.

With this arrangement, the sixth embodiment provides an effect similar to that of the fourth embodiment and, at the same time, the number of oscillation modes is reduced to improve the S/N ratio if compared with the fourth embodiment because the propagation mode is reduced.

While the anode 2903 is made to show a ring-like profile and the high resistivity region 2909 is exposed in FIG. 35, the region 2909 may be entirely covered by the anode 2903. The positions of the electrodes are not limited to those shown in FIG. 35.

The description on the position and height of and the method of forming the high resistivity region as well as the description on the materials of the active layer, the substrate and the electrodes made above by referring to the fourth and fifth embodiments are also applicable to this embodiment.

While the ring resonator type lasers of the above embodiments are described in terms of hollow cylindrical, rectangular and triangular pillar-like profiles, the profile of a ring resonator type laser according to the invention is by no means limited thereto so long as it can hold a laser beam to be transmitted clockwise and a laser beam to be transmitted counterclockwise. For example, a ring resonator type laser according to the invention may have any polygonal profile such as a pentagonal or hexagonal profile.

EXAMPLE 1

FIG. 2 is a schematic perspective view of an embodiment of gyro comprising a ring resonator type laser for having laser beams transmitted circularly. A circular waveguide path is arranged for laser beams in this embodiment, and the semiconductor laser has a hollow cylindrical profile. In FIG. 2, there are shown an electric terminal 205, an anode 203 and a cathode 204. Reference numeral 200 denotes a hollow cylindrical pillar-like semiconductor laser comprising an active layer 201. Reference numeral 202 denotes a substrate carrying the semiconductor laser thereon.

An electric current is injected into the semiconductor laser having a configuration as described above through the anode 203. The active layer 201 is made of InGaAsP having a 1.55 $\mu$m composition with a pair of guiding layers made of InGaAsP having a 1.3 $\mu$m composition and arranged respectively on and under the active layer. They are then sandwiched by a pair of InP clad layers. Since a semiconductor and air show different refractive indexes, light is reflected by the interface thereof. If the refractive index of the semiconductor is 3.5, a total internal reflection takes place when the angle between a normal to the interface and a laser beam incident upon the interface is equal to or greater than 16.6°. Since the mode of operation with total internal reflection has a low oscillation threshold value if compared with other modes of operation because it is free from any mirror loss. Therefore, laser oscillation takes place with a relatively low level of the injected electric current. Additionally oscillation in any other mode is suppressed since this oscillation mode can get a gain dominantly. If the device comprising the semiconductor laser 200 has a radius of 10 $\mu$m and the active layer has a thickness of 0.1 $\mu$m, the oscillation threshold current will be 0.2 mA. If the drive current is 0.5 mA and the device is subjected to a revolution of 30 degrees per second that may be caused by a camera shake or a moving automobile, a signal with a voltage amplitude of 100 mV and a frequency of 23.6 Hz can be obtained from the electrode terminal 205.

In an experiment conducted for comparison, a semiconductor laser having a profile as illustrated in FIG. 1 and not hollow in the inside showed an oscillation threshold current of 0.8 mA. Thus, a gyro according to the invention can be driven with a lower electric current, or it has a low oscillation threshold value.

When total internal reflection takes place, there exists evanescent light that proceeds along the interface. If the oscillation wavelength is 1.55 $\mu$m, the reach of the seeping evanescent light is 0.074 $\mu$m. Since the intensity of seeping evanescent light attenuates as an exponential function (the reach of seeping evanescent light is defined as the distance at the end of which the field amplitude attenuates to 1/e), any returning beam can be disregarded if the device is separated from a reflector by 10 $\mu$m with a wide margin. The above arrangement is described on an assumption that no reflector exists within 10 $\mu$m from the boundary of the cylindrical pillar of the semiconductor laser 200 so that the device is free from the effect of returning light that can operates as noise.

Additionally, a gyro that is free from the lock-in phenomenon when it is rotated in a frequency corresponding to a beat frequency lower than 1 Hz can be realized by modulating the injected electric current to an amplitude of 0.1 mA and a frequency of 2 kHz. It will be understood that the original signal will not be adversely affected by the modulation because a frequency band totally separated from the signal frequency is used for the modulation.

While an InGaAsP type semiconductor material is used in this example, a semiconductor material of any other type such as GaAs, ZnSe, InGaN or AlGaN may also be used for the purpose of the invention.

Figure 57:
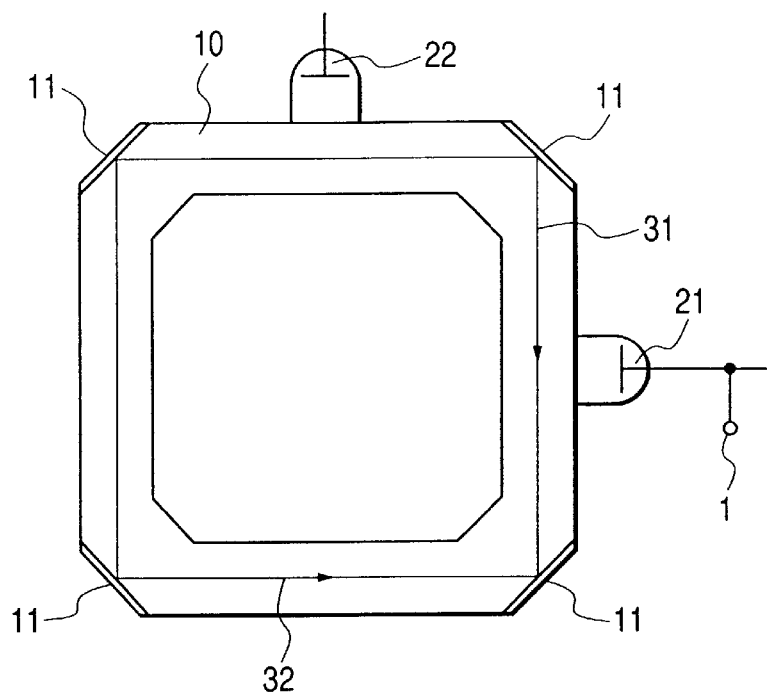
FIG. 57 is a schematic plan view of another embodiment of ring resonator type semiconductor laser according to the invention.
Figure 58:
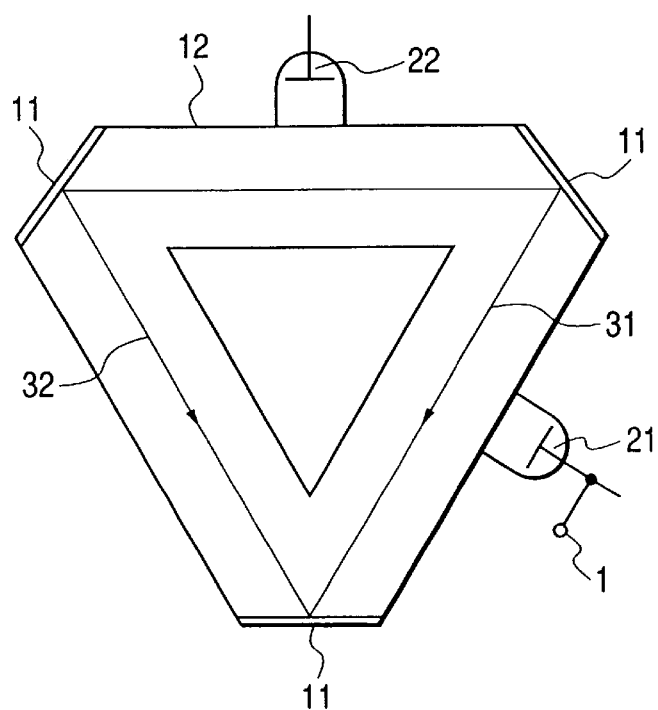
FIG. 58 is a schematic plan view of still another embodiment of ring resonator type semiconductor laser according to the invention.

A gyro according to the invention may alternatively comprise a ring resonator type gas laser as shown in FIGS. 57 and 58.

Referring to FIGS. 57 and 58, there are shown an electric terminal 1, a quartz tube 10 prepared by hollowing a piece of quartz, a mirror 11 and discharging electrodes 21 and 22, of which the electrode 21 may operate as anode and electrode 22 may operate as cathode. Reference numeral 31 denotes a laser beam propagating clockwise, whereas reference numeral 32 denotes a laser beam propagating counterclockwise.

Then, the embodiment starts electrically discharging to give rise to an electric current as helium gas and neon gas are put into the quartz tube 10 of the embodiment of gyro and a voltage is applied between the anode 21 and the cathode 22.

The oscillation frequency of the laser beam propagating clockwise and that of the laser beam propagating counterclockwise are equal to each other so long as the quartz tube 10 is in a halted state, when the oscillation frequency and the oscillation wavelength of the laser beams may be $4.73 \times 10^{14}$ Hz and 632.8 nm respectively. If the quartz tube 10 that operates as a resonator is driven to rotate at a rate of 180° per second and each of its sides has a length of 10 cm, the beat frequency will be 496.5 kHz. If the supply current is adjusted to show a constant level and the terminal voltage is monitored from the electric terminal 1, a signal with an amplitude of 100 mV and a frequency of 496.5 kHz will be obtained.

EXAMPLE 2

Figure 36:
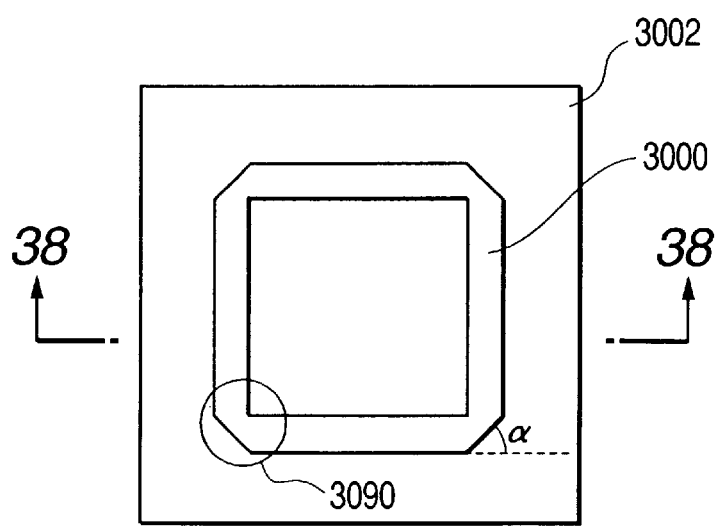
FIG. 36 is a schematic plan view of a gyro comprising a ring resonator type semiconductor laser according to the invention.
Figure 38:
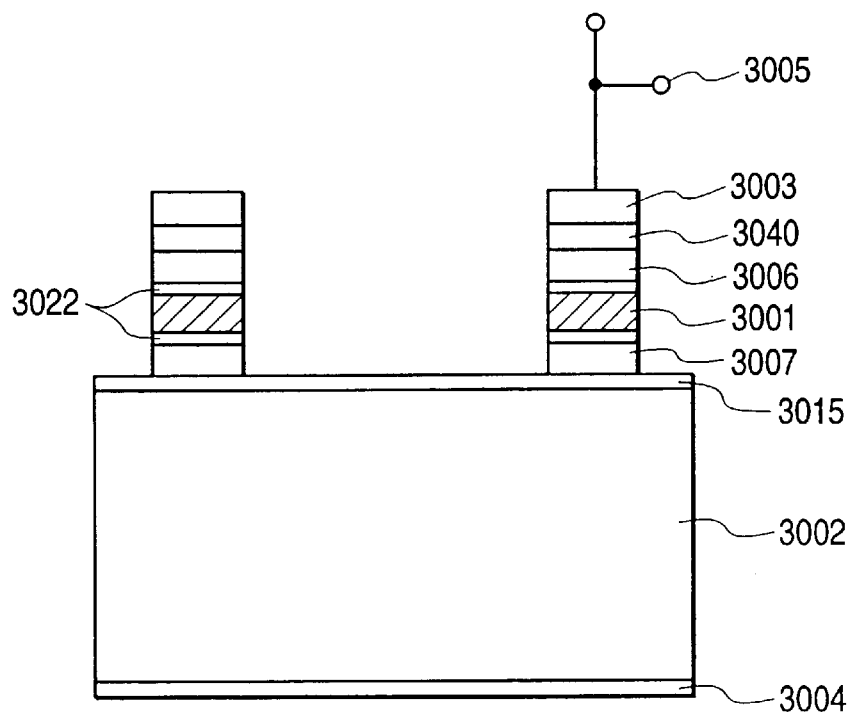
FIG. 38 is a schematic cross sectional view of the ring resonator type semiconductor laser of FIG. 36.

FIG. 36 is a schematic plan view of a gyro comprising a ring resonator type laser 3000 for having laser beams transmitted circularly. It has a rectangular waveguide path and a hollow structure as described above by referring to preferred embodiments of the invention. FIG. 38 is a schematic cross sectional view taken along line 38—38 in FIG. 36.

Referring to FIG. 38, there are shown an active layer 3001, guiding layers 3022, a substrate 3002, an anode 3003, a cathode 3004, an electric terminal 3005, cladding layers 3006 and 3007 and a cap layer 3040.

The ring resonator type laser is prepared in a manner as described below.

Figure 39:
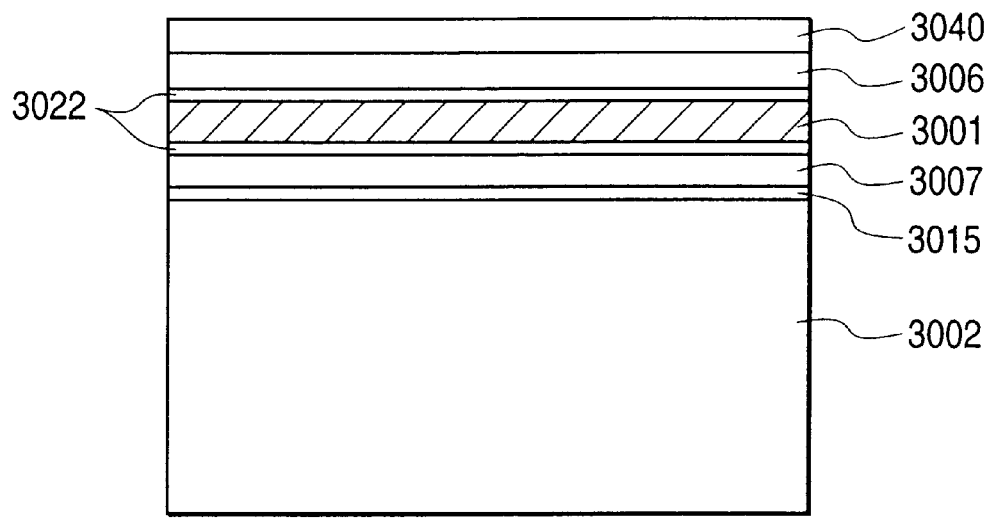
FIG. 39 is a schematic cross sectional view of the ring resonator type semiconductor laser of FIG. 38, showing a manufacturing step thereof.

Firstly, a base structure having a configuration as shown in FIG. 39 is prepared.

It comprises an n-GaAs substrate 3002, an active layer 3001 having a multiple quantum well structure of three layers of $Al_{0.3}Ga_{0.7}As/GaAs$ arranged on the substrate 3002, a pair of $Al_{0.3}Ga_{0.7}As$ guiding layers 3022 sandwiching the active layer 3001 and a pair of cladding layers 3006, 3007 sandwiching the above layers (of which the layer 3006 is made of p-$Al_{0.5}Ga_{0.5}As$ and the layer 3007 is made of n-$Al_{0.5}Ga_{0.5}As$). Reference numeral 3015 denotes an n-GaAs buffer layer. Reference numeral 3040 denotes a p-GaAs cap layer.

Figure 40:
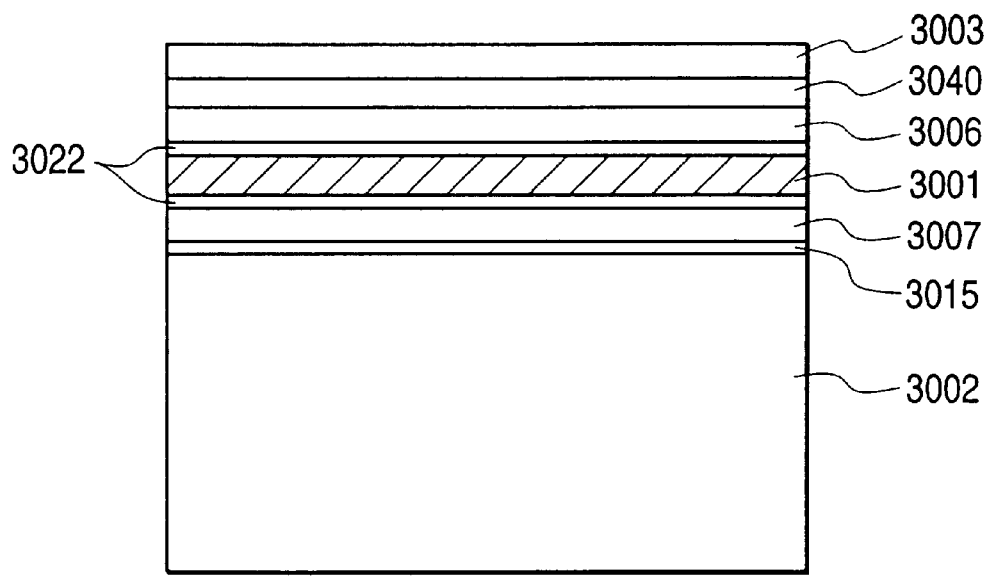
FIG. 40 is a schematic cross sectional view of the ring resonator type semiconductor laser of FIG. 38, showing another manufacturing step thereof.

Then, a Cr/Au (or Ti/Pt/Au) layer is formed on the cap layer 3040 for the anode 3003 (FIG. 40).

Figure 41:
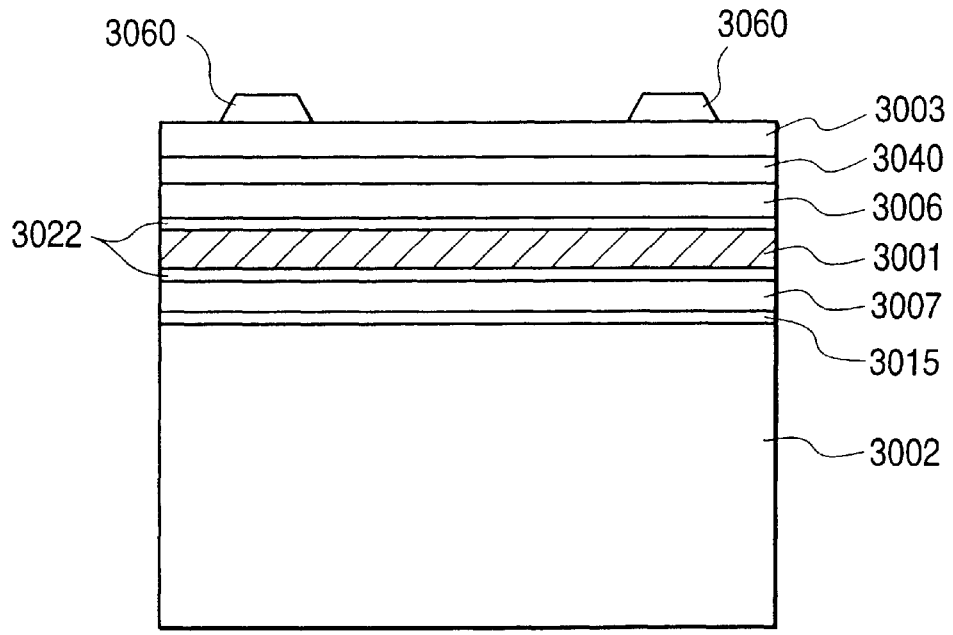
FIG. 41 is a schematic cross sectional view of the ring resonator type semiconductor laser of FIG. 38, showing still another manufacturing step thereof.

After applying photoresist 3060, it is subjected to a patterning operation to show a profile as shown in FIG. 41.

Figure 42:
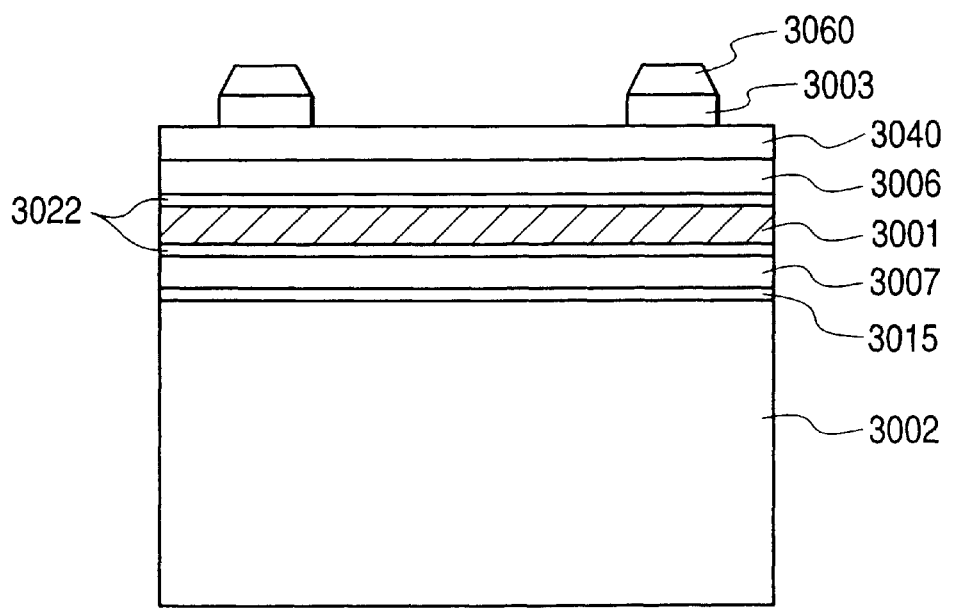
FIG. 42 is a schematic cross sectional view of the ring resonator type semiconductor laser of FIG. 38, showing still another manufacturing step thereof.

Then, the layer of the anode 3003 is subjected to a dry etching process, using the patterned photoresist 3060 as mask (FIG. 42).

Figure 45:
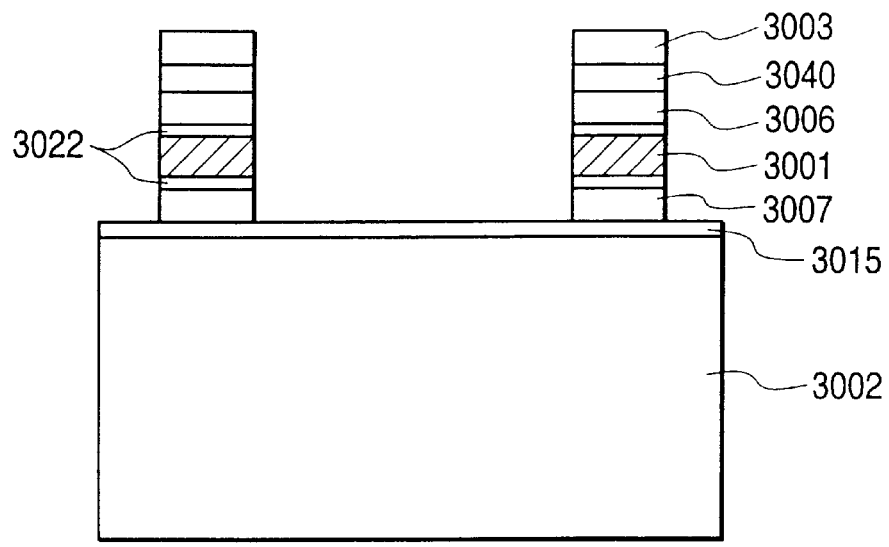
FIG. 45 is a schematic cross sectional view of the ring resonator type semiconductor laser of FIG. 38, showing still another manufacturing step thereof.

Subsequently, the underlying semiconductor layers are dry-etched (FIG. 43) and the photoresist is removed (FIG. 45).

Then, the anode is annealed in an hydrogen atmosphere to turn it into an alloy.

Figure 46:
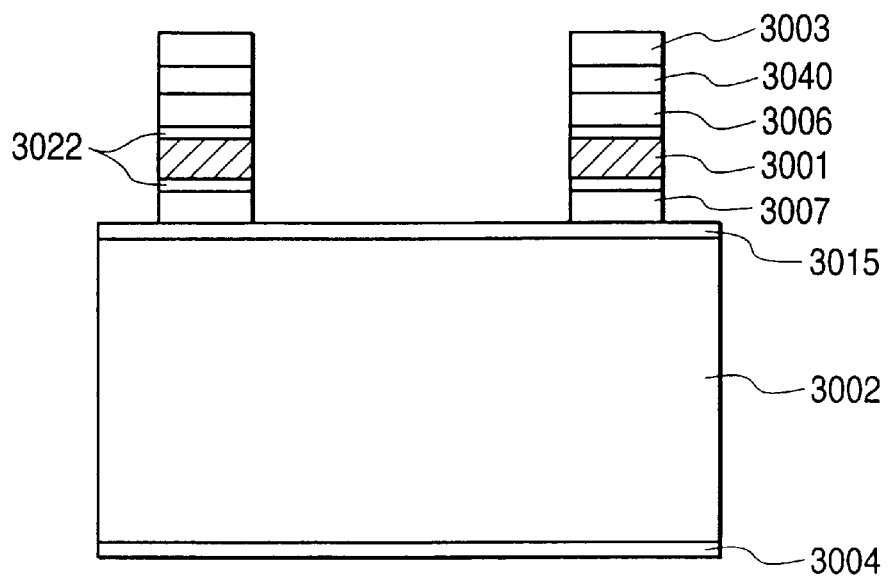
FIG. 46 is a schematic cross sectional view of the ring resonator type semiconductor laser of FIG. 38, showing still another manufacturing step thereof.

Then, if necessary, the substrate is polished and the cathode 3004 of AuGeNi/Au is produced by evaporation (FIG. 46).

In this way, a ring laser as shown in FIG. 38 is formed. If the waveguide path is 5 μm wide and is 400 μm long per side, the oscillation threshold current is 4 mA. When the drive current is 5 mA and the ring laser is driven to rotate at a rate of 30 degrees per second that may be caused by a camera shake or a moving automobile, a signal with a voltage amplitude of 100 mV and frequency of 862 Hz is obtained from the electrode terminal 3005. This means a gyro with a low oscillation threshold current.

The angle α in FIG. 36 is 45°±0.01°, preferably 45°±0.001°. This definition is applicable to the other angles of the corners. This is a requirement to be indispensably met in order for a laser beam to come back to a point that is close to the starting point as much as possible after making a full turn through the resonator.

It may be needless to say the angle a should meet the above requirement when the semiconductor ring laser is prepared by way of some other process.

Figure 37:
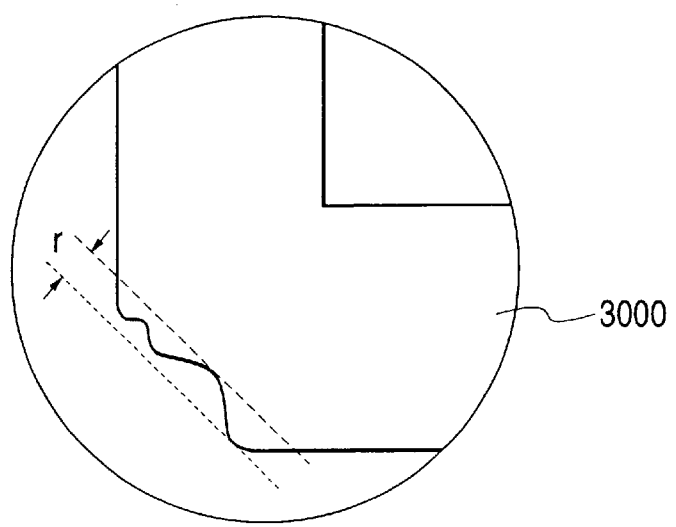
FIG. 37 is an enlarged schematic partial plan view of the gyro comprising a ring resonator type semiconductor laser of FIG. 36.

FIG. 37 is an enlarged schematic view of the corner 3090 in FIG. 36. The surface roughness r of the corner should be less than 500 Å, preferably less than 200 Å for the purpose of the invention in order to reduce any backward scattering and prevent the lock-in phenomenon from occurring.

Figure 43:
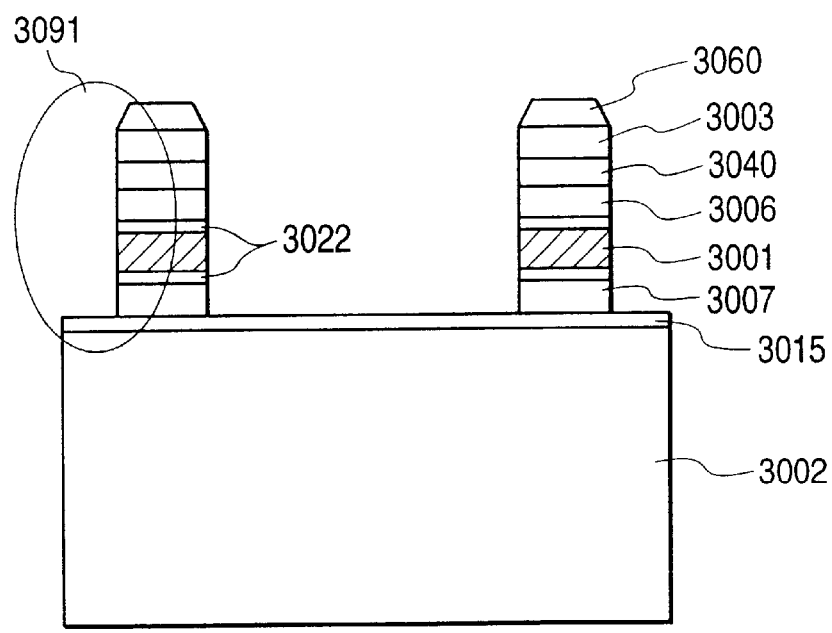
FIG. 43 is a schematic cross sectional view of the ring resonator type semiconductor laser of FIG. 38, showing still another manufacturing step thereof.
Figure 44:
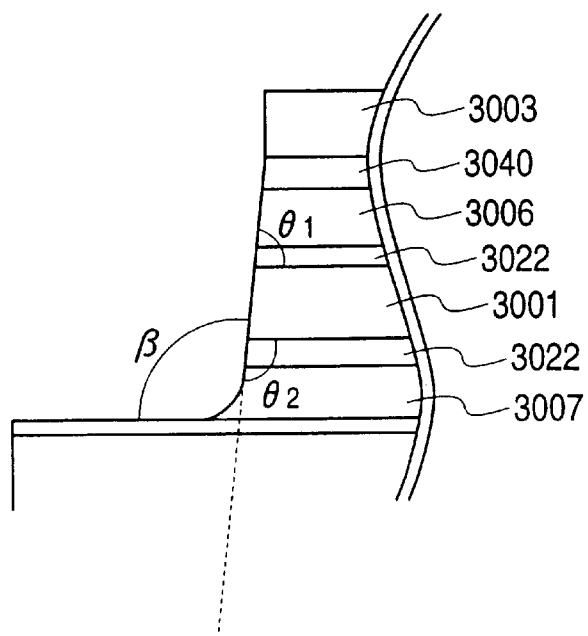
FIG. 44 is an enlarged schematic partial cross sectional view of the ring resonator type semiconductor laser of FIG. 38.

FIG. 44 is an enlarged schematic view of the encircled area 3091 in FIG. 43. As seen from FIG. 44, the angle β between the substrate and the lateral surface of the semiconductor layers should be 75°≦β≦105°, preferably 80°≦β100°, more preferably 85°≦β≦95°. The transverse mode is stabilized as the value of β approaches 90°. The angles $θ_1$, $θ_2$ in FIG. 44 should also be found within the respective ranges listed above by referring to the first embodiment.

While the angle β is described above in terms of the outside of the lateral surface of the semiconductor layers, preferably it also meets the above requirement at the inside.

While a ring laser having a rectangular waveguide path is described above, the value of the angle β preferably meets the above requirement if the waveguide path is other than rectangle (circle or triangle).

It is also desirable that the angle β between the mesa-shaped lateral surface of the semiconductor layer and the substrate meet the above requirement if the ring laser is prepared by way of some other process.

Figure 47:
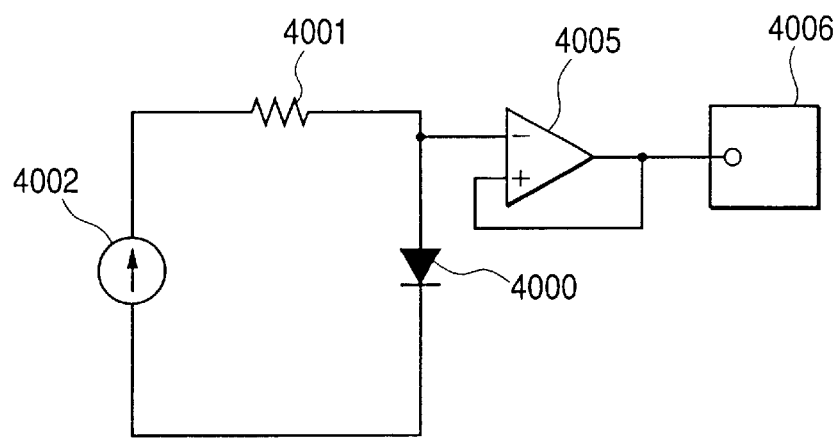
FIG. 47 is a schematic circuit diagram of a beat signal detection circuit that can be used for the purpose of the invention.

The semiconductor laser can be protected against degradation and destruction by arranging a protection circuit at the detection terminal of the semiconductor laser. FIG. 47 shows a voltage follower 4005 connected as protection circuit. In the circuit diagram of FIG. 47, reference numeral 4000 denotes a semiconductor laser and reference numeral 4001 denote a resistor, whereas reference numeral 4002 denotes a current source and reference numeral 4006 denotes a voltage detector.

Figure 48:
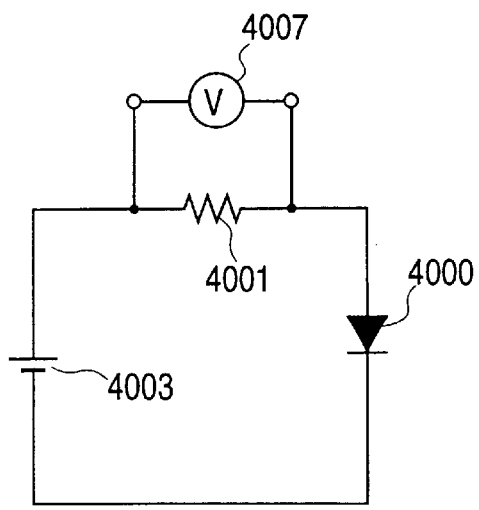
FIG. 48 is a schematic circuit diagram of another beat signal detection circuit that can be used for the purpose of the invention.
Figure 49:
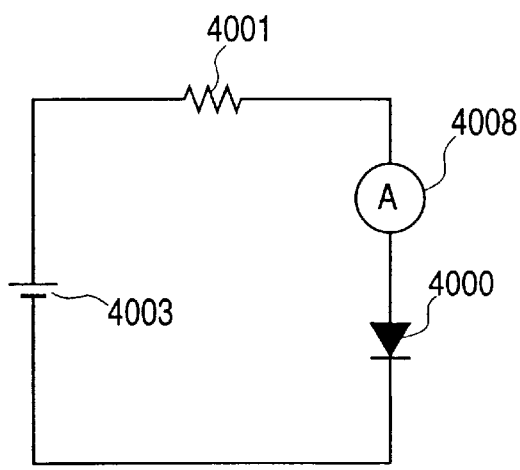
FIG. 49 is a schematic circuit diagram of still another beat signal detection circuit that can be used for the purpose of the invention.

When a constant voltage source is used as power source, the angular velocity of the semiconductor laser can be detected by observing the change in the electric current flowing to the semiconductor laser. The driving system of the semiconductor laser can be made down-sized and light-weight when a battery is used as constant voltage source as shown in FIGS. 48 and 49. In FIG. 48, a resistor is connected in series to the semiconductor laser and the electric current flowing to the semiconductor laser is detected by observing the change in the voltage at the opposite ends of the resistor. In FIG. 48, 4003 and 4007 respectively denote a battery and a voltmeter. In FIG. 49, an ammeter 4008 is connected in series to a semiconductor laser to directly observe the electric current flowing to the semiconductor laser.

Now, another circuit configuration for detecting a beat signal that can be used for the purpose of the invention will be described.

Figure 50:
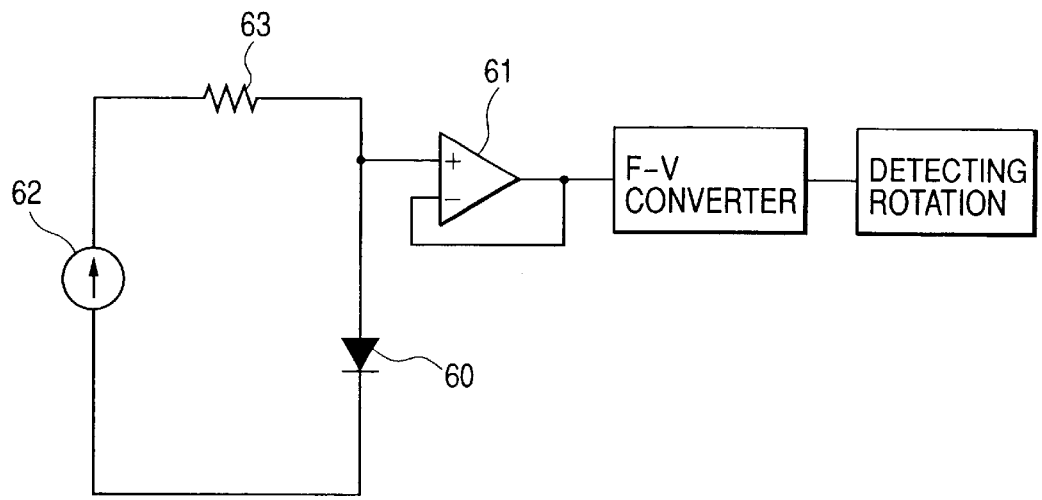
FIG. 50 is a schematic circuit diagram of still another beat signal detection circuit that can be used for the purpose of the invention.

The anode of a ring resonator type gas laser 60 is connected to an operational amplifier 61 as shown in FIG. 50. Since the signal output from the amplifier 61 has a frequency corresponding to the angular velocity, it is transformed into a voltage by a known frequency/voltage converter (F-V converter) to detect the revolution.

It may be needless to say that the operational amplifier 61 (voltage follower) may be omitted if the embodiment shows desired characteristics without it.

Figure 51:
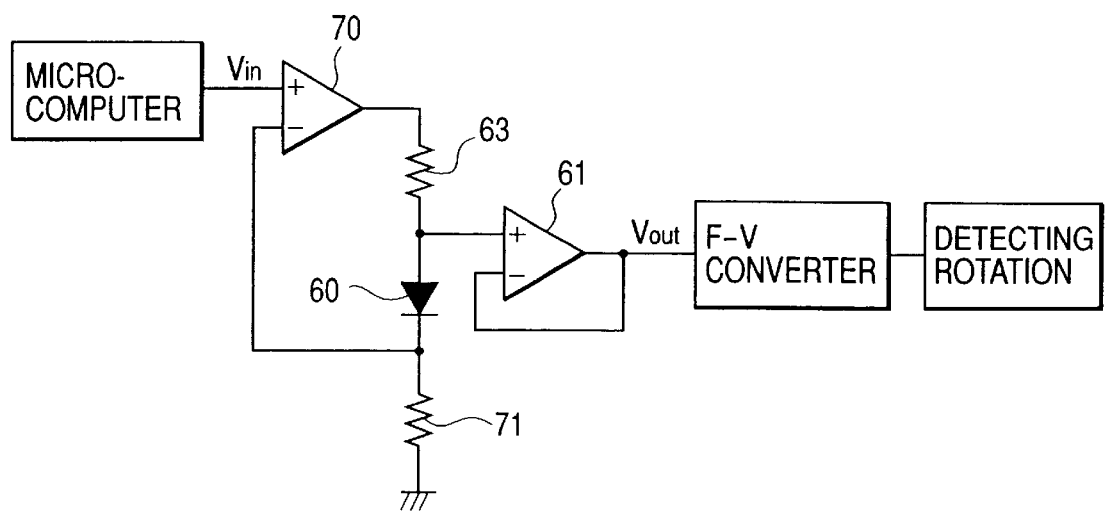
FIG. 51 is a schematic circuit diagram of still another beat signal detection circuit that can be used for the purpose of the invention.

FIG. 51 is a circuit diagram of a circuit designed to drive a laser 60 with a constant current, read the change in the anode potential of the laser 60 and detect the revolution of the laser 60.

The anode of the laser 60 is connected to the output terminal of operational amplifier 70 by way of a protective resistor 63 and the cathode of the laser 60 is connected to the inverting input terminal of the operational amplifier 70.

Resistor 71 is connected between the inverting input terminal of the operational amplifier 70 and the earth.

When a constant voltage Vin is applied to the non-inverting input terminal of the operational amplifier 70 from, for example, a microcomputer, the electric current defined by the voltage and the resistance of the resistor 71 flows to drive the laser 60 with the constant current. The anode of the laser 60 is connected to the operational amplifier 61. The operational amplifier 61 outputs signal Vout having a beat frequency proportional to the angular velocity of the laser 60, whose frequency is then transformed into a voltage by means of a known frequency/voltage converter (FV converter) so that the revolution may be detected.

Figure 52:
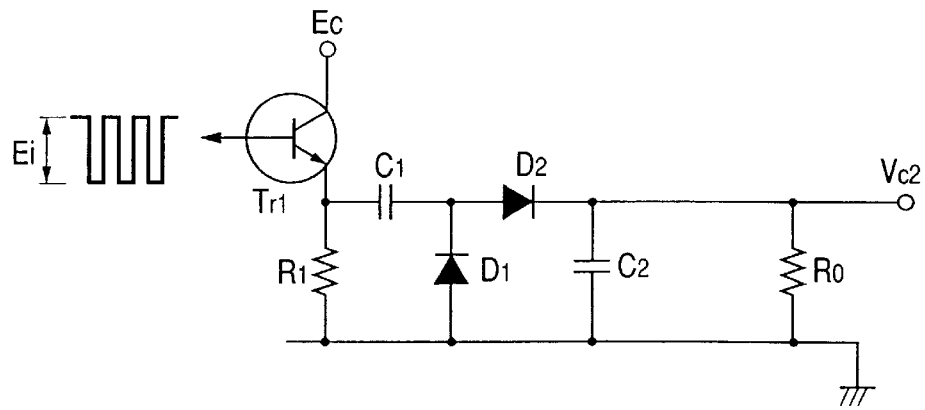
FIG. 52 is a schematic circuit diagram of an F-V converter that can be used for the purpose of the invention.

FIG. 52 is a schematic circuit diagram of a frequency/voltage converter (FV converter). The converter comprises a transistor, diodes, capacitors and resistors and its output voltage $V_{c2}$ is expressed by formula (2) below;

$$V_{c2} = E_i C_1 R_0 f [1 + 1/\{1 - \exp(-1/R_0 C_2 f)\}] \tag{2},$$

where $E_i$ is the peak-to-peak value of the input voltage and f is the beat frequency. By selecting circuit parameters that make $C_2 >> C_1$ and $R_0 C_2 f < 1$, the formula (2) is reduced to formula (3) below;

$$V_{c2} \approx E_i C_1 R_0 f / 2 \tag{3},$$

so that it is now possible to obtain a voltage output that is proportional to the beat frequency.

Figure 53:
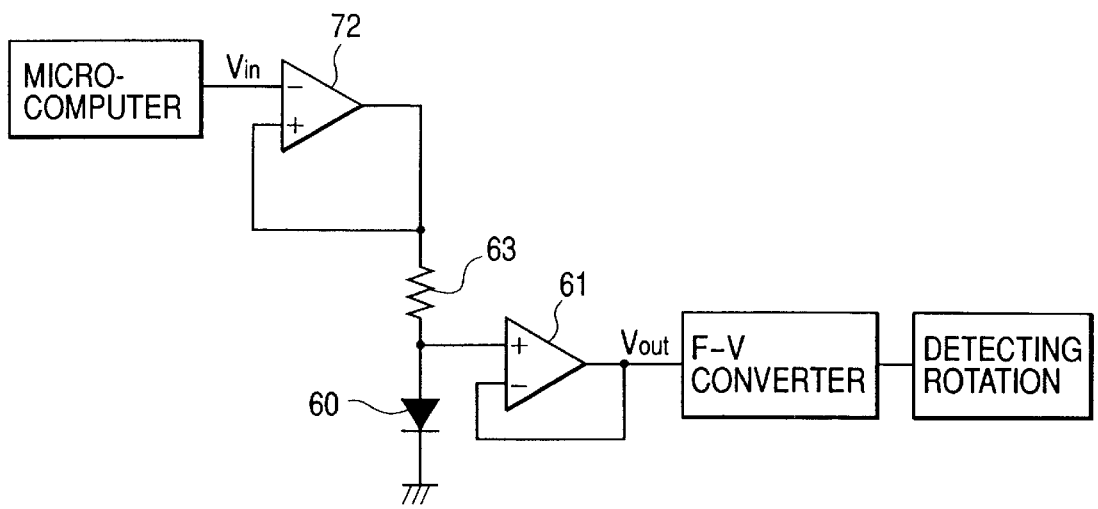
FIG. 53 is a schematic circuit diagram of still another beat signal detection circuit that can be used for the purpose of the invention.

FIG. 53 is a circuit diagram of a circuit for detecting the revolutions per unit time of a laser by driving the laser 60 with a constant voltage and reading the change in the anode voltage of the laser.

The anode of the laser 60 is connected to the output terminal of an operational amplifier 72 by way of a resistor 63 and the cathode of the laser 60 is grounded to provide a reference potential.

When a constant voltage Vin is applied to the inverting input terminal of the operational amplifier 72 from a microcomputer, the voltage is constantly applied to the resistor 63 and the laser 60 to realize a constant voltage drive arrangement.

The resistor 63 is connected to the operational amplifier 61 as buffer. The operational amplifier 61 outputs signal Vout. Since this signal is has a beat frequency that is proportional to the angular velocity, it is transformed into a voltage by means of a known frequency/voltage converter (F-V converter) to detect the revolutions per unit time. It may be needless to say that the revolutions per unit time can also be detected by feeding the FV converter with a signal obtained from a portion of the circuit showing a potential equal to that of the resistor.

A frequency counter may be used as means for detecting a beat signal.

Figure 60:
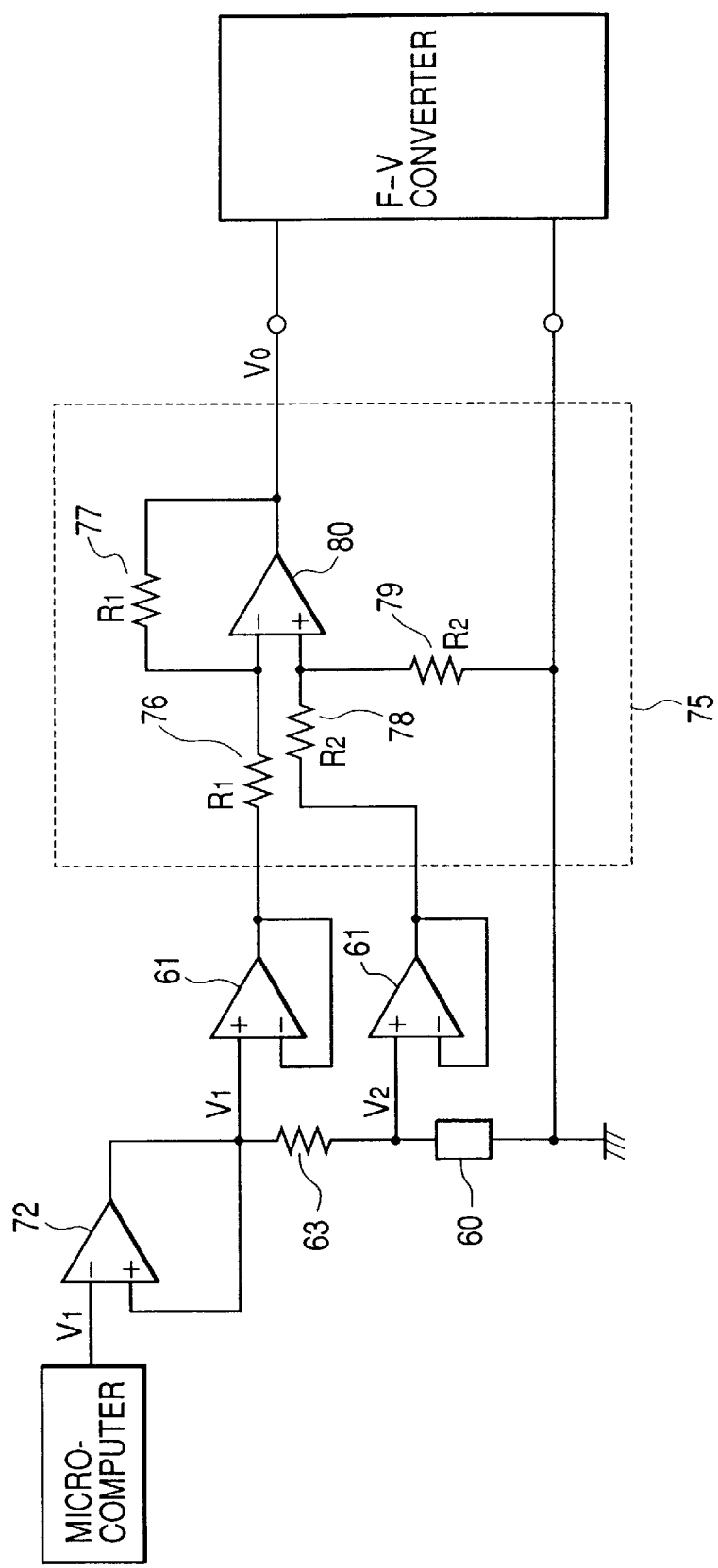
FIG. 60 is a schematic circuit diagram of still another beat signal detection circuit that can be used for the purpose of the invention.

FIG. 60 is a circuit diagram of a circuit realizing by adding a subtractor 75 to a constant voltage drive arrangement similar to that of FIG. 53 in order to use the ground voltage as reference for the signal voltage.

With this arrangement, a constant potential $V_1$ is applied to the inverting input terminal of the operational amplifier 72 from a microcomputer. In FIG. 60, reference numerals 60 and 61 respectively denotes a ring resonator type laser and voltage followers and reference numerals 63 and 76 through 79 denote respective resistors. The resistors 76 and 77 and the resistors 78 and 79 have equal resistance values, respectively.

The voltage $V_1$ and $V_2$ of the opposite ends of the resistor 63 are applied respectively to the inverting input terminal and the non-inverting input terminal of the amplifier 80 by way of voltage the respective voltage followers and the respective resistors 76 and 78. With this arrangement, the change in the voltage $V_2 - V_1$ ($V_0$) applied to the resistor 63 can be detected by using the ground voltage as reference. Therefore, the change in the electric current flowing to the ring resonator type laser 60 can be detected.

The obtained signal is then fed to an F-V converter to detect the rotation.

Figure 54:
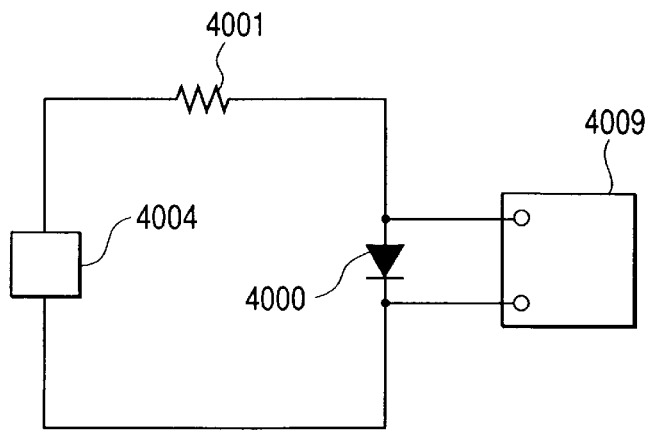
FIG. 54 is a schematic circuit diagram of still another beat signal detection circuit that can be used for the purpose of the invention.

It is also possible to observe the change in the impedance of a semiconductor laser directly by means of an impedance meter 4009 regardless of the type of current source. With this arrangement, the influence of the drive power source noise can be minimized unlike the arrangement of observing the voltage of a terminal or the electric current flowing to an element. FIG. 54 is a circuit diagram of such a circuit arrangement. In FIG. 54, reference numeral 4004 denotes a power source.

EXAMPLE 3

FIG. 2 is a schematic perspective view of a gyro comprising a ring resonator type laser for having laser beams transmitted circularly. The semiconductor laser of the gyro has a hollow cylindrical pillar-like profile. Otherwise, the gyro is identical with that of Example 1.

With this arrangement, the laser beams circulate along the interface of the semiconductor so that semiconductor laser 200 does not need to have a central region. By making the semiconductor laser 200 have a hollow cylindrical pillar-like profile as shown in FIG. 2, only the circulating beams can take the gain and the volume of the active layer can be reduced to make it possible to further reduce the drive current.

EXAMPLE 4

FIG. 27 is a schematic perspective view of a gyro comprising a ring resonator type laser for having laser beams transmitted circularly. The semiconductor laser is made to show a high resistivity in a central region (cross-hatched in FIG. 27) thereof by ion implantation. Protons are used for the ion implantation and implanted at a rate of $5 \times 10^{14}$ cm$^{-2}$ with an acceleration voltage of 100 keV. Since laser beams may be distributed in the proton-implanted region, the semiconductor laser is annealed at 350° C. for 15 minutes in order to reduce the absorption loss for light in this region. Otherwise, this gyro is prepared same as that of Example 1.

With this arrangement, only the circulating beams can take the gain and the volume of the active layer can be reduced to make it possible to further reduce the drive current as in the case of Example 3.

EXAMPLE 5

FIG. 14 is a schematic perspective view of a gyro comprising a ring resonator type laser for having laser beams transmitted circularly. This gyro differs from that of Example 3 (FIG. 2) in that the semiconductor laser of the gyro has a rectangular pillar-like profile. Otherwise, the gyro is identical with that of Example 3.

With this arrangement, the number of oscillation modes is reduced to improve the S/N ratio if compared with the gyro of Example 3 because the propagation mode is further reduced.

EXAMPLE 6

FIG. 31 is a schematic perspective view of a gyro comprising a ring resonator type laser for having laser beams transmitted circularly. This gyro differs from that of Example 4 (FIG. 27) in that the semiconductor laser of the gyro has a rectangular pillar-like profile. Otherwise, the gyro is identical with that of Example 4.

With this arrangement, the number of oscillation modes is reduced to improve the S/N ratio if compared with the gyro of Example 4 because the propagation mode is further reduced.

EXAMPLE 7

FIG. 26 is a schematic perspective view of a gyro comprising a ring resonator type laser for having laser beams transmitted circularly. This gyro differs from that of Example 5 (FIG. 14) in that the semiconductor laser of the gyro has a triangular pillar-like profile.

Otherwise, the gyro is identical with that of Example 5.

With this arrangement, the number of oscillation modes is reduced to improve the S/N ratio if compared with the gyro of Example 5 because the propagation mode is further reduced.

EXAMPLE 8

FIG. 35 is a schematic perspective view of a gyro comprising a ring resonator type laser for having laser beams transmitted circularly. This gyro differs from that of Example 6 (FIG. 31) in that the semiconductor laser of the gyro has a triangular pillar-like profile.

Otherwise, the gyro is identical with that of Example 6.

With this arrangement, the number of oscillation modes is reduced to improve the S/N ratio if compared with the gyro of Example 6 because the propagation mode is further reduced.

EXAMPLE 9

Figure 55:
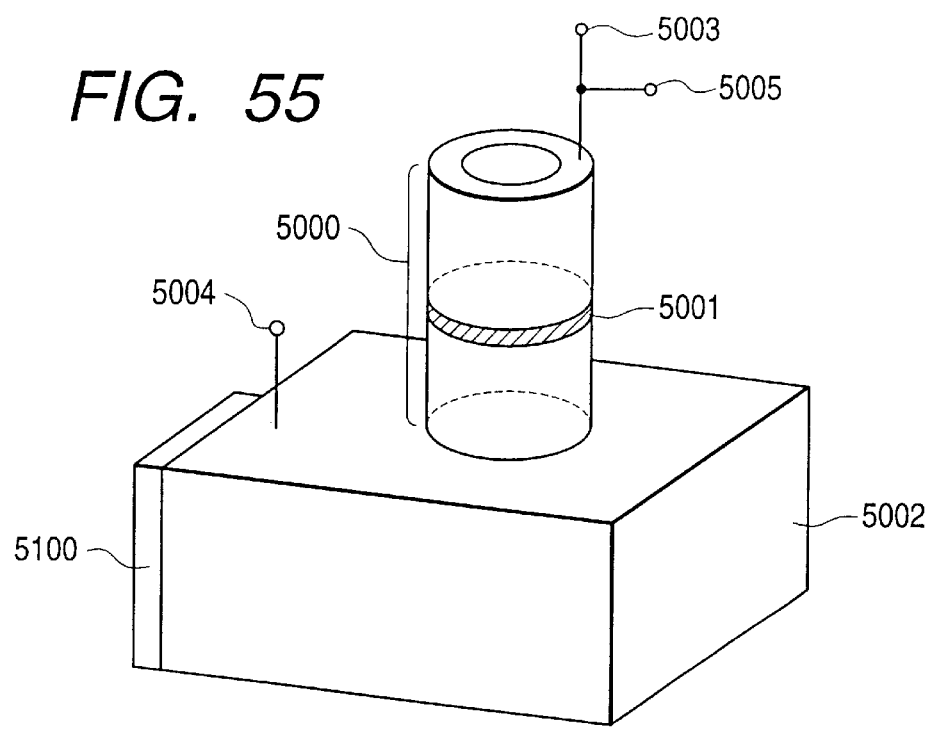
FIG. 55 is a schematic perspective view of another embodiment of a gyro comprising a ring resonator type semiconductor laser according to the invention.

FIG. 55 is a schematic perspective view of a gyro comprising a ring resonator type laser for having laser beams transmitted circularly. This gyro differs from that of Example 1 (FIG. 2) in that the substrate 5002 of the semiconductor laser 5000 of the gyro is provided with a piezoelectric element 5100. Otherwise, the gyro is identical with that of Example 1.

With the above arrangement, it is possible to drive the semiconductor laser 5000 of the gyro clockwise or counterclockwise by applying a voltage having a frequency of 20 kHz to the piezoelectric element 5100. Then, a clockwise rotation of the semiconductor laser can be identified and differentiated from a counterclockwise rotation by detecting the signal synchronized with the applied voltage from terminal 5005 to the piezoelectric element 5100. For example, the frequency of the terminal voltage will be raised if the semiconductor laser 5000 is driven to turn clockwise by applying an oscillation for a clockwise rotation. Contrary, the frequency of the terminal voltage will be lowered if the semiconductor laser 5000 is driven to turn counterclockwise by applying an oscillation for a clockwise rotation. Additionally, the sense of rotation of the semiconductor laser can be detected easily without adversely affecting the signal by modulating the signal with a frequency band that is totally different from the signal frequency. While the semiconductor laser has a circular waveguide path in the illustration, it may alternatively have a rectangular or triangular waveguide path (as shown in FIGS. 14 and 26 respectively) by using such a piezoelectric element.

As described above in detail, with a gyro according to the invention and comprising a ring resonator type laser for having laser beams transmitted circularly, the beat signal representing the revolutions per unit time of the gyro can be taken out from a terminal by detecting the change in the electric current, the voltage or the impedance attributable to the beat generated by the interference of the laser beams transmitted within the laser in opposite senses. Thus, a gyro according to the invention is free from a photodetector or an optical system for optical coupling, the use of which is indispensable to known gyros. Additionally, a gyro according to the invention can reduce the driving power level because the effective volume of the active layer of the semiconductor laser can be reduced.

What is claimed is:

1. A gyro, comprising:
   a ring resonator type semiconductor laser having laser beams transmitted circularly in opposite directions relative to each other, said laser including a terminal for detecting a beat signal and a ring-shaped active layer; and
   a driving power source for driving said semiconductor laser, said driving power source being modulated with a frequency in a frequency band different from that of the beat signal.

2. A gyro according to claim 1, wherein said ring resonator type semiconductor laser has a barrel-like structure.

3. A gyro according to claim 1, wherein said active layer is sandwiched by low refractive index layers showing a refractive index lower than said active layer, said active layer and said low refractive index layers having a barrel-like structure.

4. A gyro according to claim 2, wherein said barrel-like structure has an insulating thin film at least either on an inside or on an outside thereof.

5. A gyro according to claim 1, wherein the beat signal is detected as a change in the electric current, the voltage or the impedance.

6. A gyro according to claim 1, wherein said semiconductor laser is driven by a constant voltage or a constant current.

7. A gyro according to claim 1, wherein said semiconductor laser has a triangular, rectangular or circular barrel-like structure.

8. A gyro according to claim 1, wherein said semiconductor laser is made of GaAs or InP.

9. A gyro, comprising:
   a ring resonator type semiconductor laser having laser beams transmitted circularly in opposite directions relative to each other, said laser including a ring-shaped active layer;
   means for detecting a beat signal generated by rotation of said ring resonator type semiconductor laser; and
   a driving power source for driving said semiconductor laser, said driving power source being modulated with a frequency in a frequency band different from that of the beat signal.

10. A gyro according to claim 9, wherein said beat signal detection means includes at least a voltage detector, a current detector or an impedance detector.

11. A gyro according to claim 9, wherein said beat signal detection means includes a frequency/voltage converter.

12. A gyro according to claim 9, wherein said beat signal detection means includes a frequency counter.

13. A gyro, comprising:
   a ring resonator type semiconductor laser having laser beams transmitted circularly in opposite directions relative to each other, said ring resonator type semiconductor laser having a central region at least partly showing a high resistivity and a terminal for detecting a beat signal; and a driving power source for driving said semiconductor laser, said driving power source being modulated with a frequency in a frequency band different from that of the beat signal.

14. A gyro according to claim 13, wherein said central region is a central area of said semiconductor laser as viewed from above.

15. A gyro according to claim 13, wherein said central region showing a high resistivity is an active layer of said semiconductor laser.

16. A gyro according to claim 13, wherein said central region showing a high resistivity is a cladding layer arranged on an active layer of said semiconductor laser.

17. A gyro according to clam 13, wherein the high resistivity is produced by implanting ions into said semiconductor laser.

18. A gyro according to claim 13, wherein the high resistivity is produced by implanting protons into a central area of said semiconductor laser as ion implantation.

19. A gyro according to claim 13, wherein said semiconductor laser has a triangular, rectangular or circular pillar-like structure.

20. A gyro according to claim 13, wherein said semiconductor laser is made of GaAs or InP.

21. A gyro, comprising:

a ring resonator type semiconductor laser having laser beams transmitted circularly in opposite directions relative to each other, said ring resonator type semiconductor laser having a central region at least partly showing a high resistivity;

means for detecting a beat signal generated by rotation of said ring resonator type semiconductor laser; and a driving power source for driving said semiconductor laser, said driving power source being modulated with a frequency in a frequency band different from that of the beat signal.

22. A gyro according to claim 21, wherein said beat signal detection means includes at least a voltage detector, a current detector or an impedance detector.

23. A gyro according to claim 21, wherein said beat signal detection means includes a frequency/voltage converter.

24. A gyro according to claim 21, wherein said beat signal detection means includes a frequency counter.

25. A semiconductor device, comprising:

a ring resonator type semiconductor laser having laser beams transmitted circularly in opposite directions relative to each other, said laser including a ring-shaped active layer, and a terminal for detecting a beat signal; and a driving power source for driving said semiconductor laser, said driving power source being modulated with a frequency in a frequency band different from that of the beat signal.

26. A method of operating a gyro as defined in claim 1 or 13, using a frequency change of the electric current, voltage or impedance detected at the terminal as a signal for determining the magnitude of the angular velocity applied to the ring resonator type semiconductor laser.

* * * * *

UNITED STATES PATENT AND TRADEMARK OFFICE
CERTIFICATE OF CORRECTION

PATENT NO. : 6,275,296 B1
DATED : August 14, 2001
INVENTOR(S) : Takahiro Numai

It is certified that error appears in the above-identified patent and that said Letters Patent is hereby corrected as shown below:

Column 15,
Line 56, "sell" should read -- well --.

Column 21,
Line 62, "a" should read -- $\alpha$ --.

Signed and Sealed this

Ninth Day of April, 2002

Attest:

Attesting Officer

JAMES E. ROGAN
Director of the United States Patent and Trademark Office